US011710660B2

(12) United States Patent
Ikenoue et al.

(10) Patent No.: US 11,710,660 B2
(45) Date of Patent: Jul. 25, 2023

(54) LASER IRRADIATION METHOD AND LASER IRRADIATION SYSTEM

(71) Applicants: Gigaphoton Inc., Tochigi (JP); KYUSHU UNIVERSITY, NATIONAL UNIVERSITY CORPORATION, Fukuoka (JP)

(72) Inventors: Hiroshi Ikenoue, Fukuoka (JP); Osamu Wakabayashi, Oyama (JP); Hiroaki Oizumi, Oyama (JP); Akira Suwa, Oyama (JP)

(73) Assignees: Gigaphoton Inc., Tochigi (JP); KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 536 days.

(21) Appl. No.: 16/855,427

(22) Filed: Apr. 22, 2020

(65) Prior Publication Data
US 2020/0266105 A1 Aug. 20, 2020

Related U.S. Application Data

(63) Continuation of application No. PCT/JP2017/045969, filed on Dec. 21, 2017.

(51) Int. Cl.
*H01L 21/225* (2006.01)
*H01L 21/268* (2006.01)
(Continued)

(52) U.S. Cl.
CPC .......... *H01L 21/78* (2013.01); *G02B 27/0955* (2013.01); *G02F 1/0121* (2013.01);
(Continued)

(58) Field of Classification Search
CPC ..... H01L 21/78; H01L 21/223; H01L 21/268; H01L 21/67092; H01L 21/67115;
(Continued)

(56) References Cited

U.S. PATENT DOCUMENTS 5,871,826 A 2/1999 Mei et al.
10,658,183 B2 * 5/2020 Iguchi .................. H01L 29/1608
(Continued)

FOREIGN PATENT DOCUMENTS

JP H0555259 A 3/1993
JP H08139048 A 5/1996
(Continued)

OTHER PUBLICATIONS

An Office Action; "Notice of Reasons for Refusal," mailed by the Japanese Patent Office dated Nov. 12, 2021, which corresponds to Japanese Patent Application No. 2019-559967 and is related to U.S. Appl. No. 16/855,427 with English language translation.
(Continued)

*Primary Examiner* — Mary A Wilczewski
(74) *Attorney, Agent, or Firm* — Studebaker & Brackett PC

(57) ABSTRACT

A laser irradiation method of irradiating, with a pulse laser beam, an irradiation object in which an impurity source film is formed on a semiconductor substrate includes: reading fluence per pulse of the pulse laser beam with which a rectangular irradiation region set on the irradiation object is irradiated and the number of irradiation pulses the irradiation region is irradiated, the fluence being equal to or larger than a threshold at or beyond which ablation potentially occurs to the impurity source film when the irradiation object is irradiated with pulses of the pulse laser beam in the irradiation pulse number and smaller than a threshold at or beyond which damage potentially occurs to the surface of
(Continued)

the semiconductor substrate; calculating a scanning speed Vdx; and moving the irradiation object at the scanning speed Vdx relative to the irradiation region while irradiating the irradiation region with the pulse laser beam at the repetition frequency f.

5 Claims, 26 Drawing Sheets

(51) Int. Cl.
| | |
|---|---|
| H01L 21/67 | (2006.01) |
| H01S 3/11 | (2023.01) |
| H01S 3/225 | (2006.01) |
| G02F 1/01 | (2006.01) |
| G02B 27/09 | (2006.01) |
| H01L 21/78 | (2006.01) |
| H01L 21/223 | (2006.01) |
| H01S 3/23 | (2006.01) |

(52) U.S. Cl.
CPC .......... *H01L 21/223* (2013.01); *H01L 21/268* (2013.01); *H01L 21/67092* (2013.01); *H01L 21/67115* (2013.01); *H01S 3/11* (2013.01); *H01S 3/225* (2013.01); *H01S 3/2308* (2013.01); *G02F 2203/48* (2013.01)

(58) Field of Classification Search
CPC ............. H01L 21/0455; G02B 27/0955; G02F 1/0121; G02F 2203/48; H01S 3/11; H01S 3/225; H01S 3/2308; H01S 3/0057; B23K 26/032; B23K 26/0622; B23K 26/0732; B23K 26/0861; B23K 26/123; B23K 26/127; B23K 26/18; B23K 26/352; B23K 26/354
See application file for complete search history.

(56) References Cited

U.S. PATENT DOCUMENTS

| | | |
|---|---|---|
| 2004/0110335 A1 | 6/2004 | Jyumonji |
| 2010/0213166 A1 | 8/2010 | Kray et al. |
| 2013/0285070 A1 | 10/2013 | Kawai et al. |
| 2016/0247681 A1 | 8/2016 | Ikeda et al. |
| 2017/0233889 A1* | 8/2017 | Nishibayashi .......... C23C 16/56 428/155 |
| 2017/0365475 A1 | 12/2017 | Ohkubo et al. |
| 2020/0266105 A1* | 8/2020 | Ikenoue ............ H01L 21/67092 |

FOREIGN PATENT DOCUMENTS

| | | | |
|---|---|---|---|
| JP | H08264468 A | 10/1996 | |
| JP | H1050624 A | 2/1998 | |
| JP | 2004006703 A | 1/2004 | |
| JP | 2006-041082 * | 2/2006 | .......... H01L 21/268 |
| JP | 2009524523 A | 7/2009 | |
| JP | 2010212530 A | 9/2010 | |
| JP | 2011514664 A | 5/2011 | |
| JP | 2013214657 A | 10/2013 | |
| JP | 2016157911 A | 9/2016 | |
| JP | WO 2019/123612 * | 12/2020 | .......... H01L 21/268 |
| WO | 2009100015 A2 | 8/2009 | |
| WO | 2016151723 A1 | 9/2016 | |
| WO | WO 2019/123611 * | 6/2019 | ............. H01L 21/22 |

OTHER PUBLICATIONS

International Search Report issued in PCT/JP2017/045969; dated Mar. 20, 2018.

International Preliminary Report on Patentability and Written Opinion issued in PCT/JP2017/045969; dated Jun. 23, 2020.

\* cited by examiner

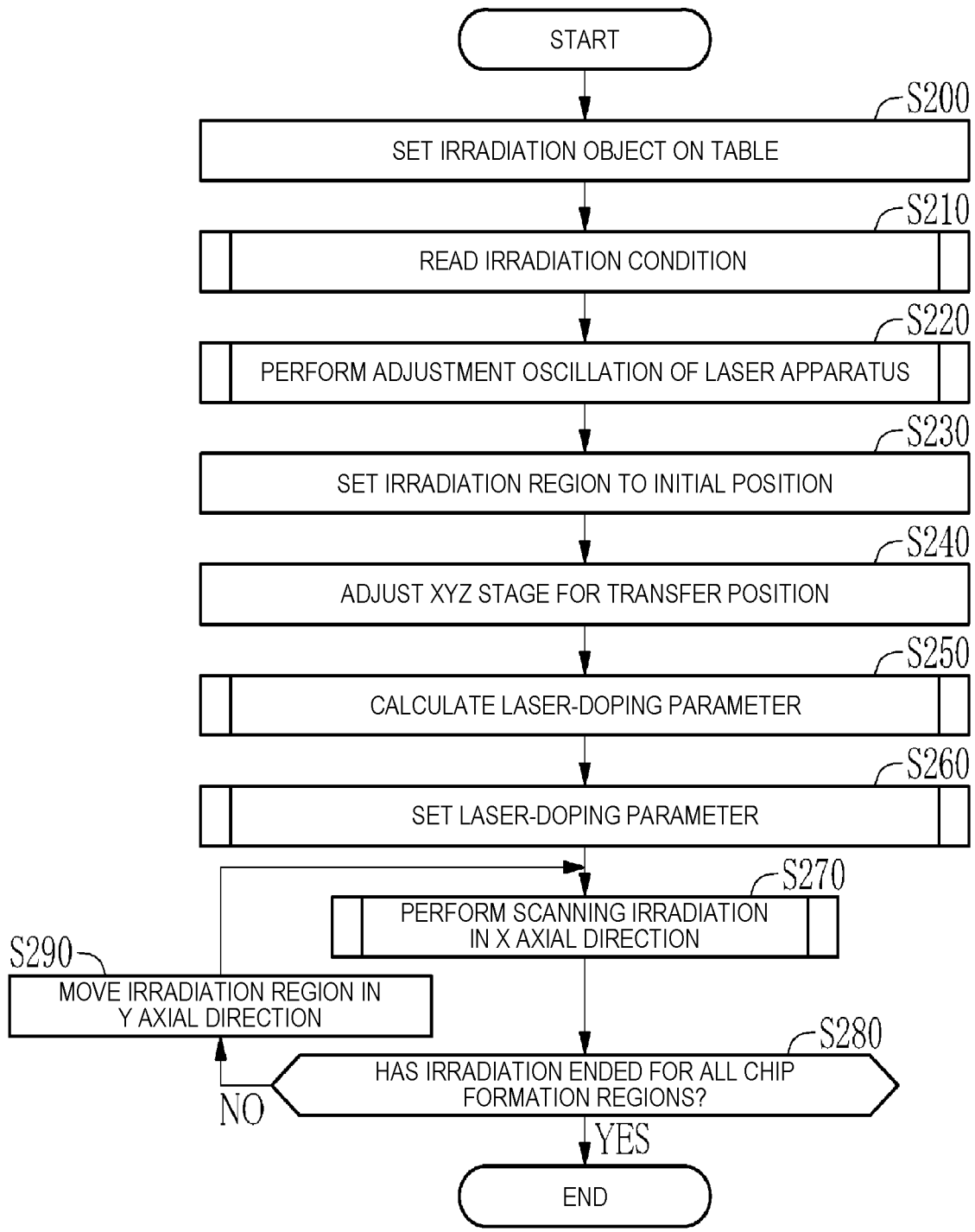

LASER IRRADIATION METHOD AND LASER IRRADIATION SYSTEM

CROSS-REFERENCE TO RELATED APPLICATIONS

The present application is a continuation application of International Application No. PCT/JP2017/045969, filed on Dec. 21, 2017, the entire contents of which are hereby incorporated by reference.

BACKGROUND

1. Technical Field

The present disclosure relates to a laser irradiation method and a laser irradiation system.

2. Related Art

Semiconductors are materials included in an active element such as an integrated circuit, a power device, a light-emitting diode (LED), a liquid crystal display, or an organic electro luminescence (EL) display, and are absolutely essential in electronic device manufacturing. To manufacture such an active element, a semiconductor substrate needs to be doped with impurities as dopants and then the impurities needs to be activated to control the electric property of the semiconductor substrate to the n-type or the p-type.

Typically, doping of a semiconductor substrate with impurities and activation of the impurities are performed by a thermal diffusion method or an ion injection method. In the thermal diffusion method, a semiconductor substrate is heated to a high temperature in gas containing impurities to thermally diffuse the impurities from the surface of the semiconductor substrate into the inside of the semiconductor substrate and then activate the impurities.

The ion injection method includes an ion injection process and a thermal annealing process. In the ion injection process, a semiconductor substrate is irradiated with an ion beam of impurities accelerated to fast speed to inject the impurities into the semiconductor substrate. In the thermal annealing process, thermal energy is provided to the semiconductor substrate to repair defects generated inside the semiconductor through the impurity injection and activate the impurities. The ion injection method has such excellent characteristics that an ion injection region can be locally set by using a mask such as resist and depth control of impurity concentration can be precisely performed. Thus, the ion injection method is widely used as the technology of manufacturing an integrated circuit by using silicon (Si).

Silicon carbide (SiC) has been developed as a next generation power device material. SiC has, for example, a large bandgap, a breakdown field characteristic about 10 times higher than that of Si, and excellent thermal conductivity as compared to Si, which is conventionally used as a semiconductor material. In addition, SiC is thermochemically stable.

To produce a transistor by using SiC, SiC needs to be doped with impurities. However, when SiC is doped with impurities by the conventional ion injection method used for Si, heat damage occurs to Si and defects are formed, which decreases the electric property.

Thus, a laser doping method has been discussed as a method of doping SiC with impurities. In the laser doping method, an impurity source film containing dopants is formed on the surface of a semiconductor substrate and irradiated with a laser beam to introduce the impurities contained in the impurity source film into the semiconductor substrate.

LIST OF DOCUMENTS

Patent Documents

Patent Document 1: Japanese Unexamined Patent Application Publication No. 5-55259
Patent Document 2: Japanese Unexamined Patent Application Publication No. 8-139048
Patent Document 3: Japanese Unexamined Patent Application Publication No. 8-264468
Patent Document 4: U.S. Patent No. 2016/0247681
Patent Document 5: International Patent Publication No. 2016/151723

SUMMARY

A laser irradiation method according to an aspect of the present disclosure irradiates an irradiation object in which an impurity source film containing at least an impurity element as a dopant is formed on a semiconductor substrate with a pulse laser beam having photon energy larger than the bandgap energy of the semiconductor substrate, the laser irradiation method including:

reading, as a first irradiation condition for laser doping, first fluence that is fluence per pulse of a pulse laser beam with which an irradiation region having a rectangular shape and set on the irradiation object is irradiated and a first irradiation pulse number that is the number of irradiation pulses the irradiation region is irradiated, the number being equal to or larger than two, the first fluence being equal to or larger than a threshold at or beyond which ablation potentially occurs to the impurity source film when the irradiation object is irradiated with the pulse laser beam in the same number of pulses as the first irradiation pulse number and smaller than a threshold at or beyond which damage potentially occurs to the surface of the semiconductor substrate;

calculating a first scanning speed Vdx based on Expression (a) below when Bx represents the width of the irradiation region in a scanning direction, Nd represents the first irradiation pulse number, and f represents the repetition frequency of the pulse laser beam; and moving the irradiation object at the first scanning speed Vdx relative to the irradiation region while irradiating the irradiation region with the pulse laser beam at the repetition frequency f.

$$Vdx = f \cdot Bx/Nd \quad \text{(a)}$$

A laser irradiation system according to an aspect of the present disclosure includes:

a stage configured to move, in at least one scanning direction, an irradiation object in which an impurity source film containing at least an impurity element as a dopant is formed on a semiconductor substrate;

a laser apparatus configured to generate a pulse laser beam having photon energy larger than the bandgap energy of the semiconductor substrate;

an optical system through which the pulse laser beam is shaped to have a rectangular beam shape and incident on an irradiation region having a rectangular shape and set on the irradiation object; and a laser irradiation control unit configured to control the stage and the laser apparatus and perform processing of;

reading, as a first irradiation condition for laser doping, first fluence that is fluence per pulse of the pulse laser beam with which the irradiation region is irradiated and a first irradiation pulse number that is the number of irradiation pulses the irradiation region is irradiated, the number being equal to or larger than two, the first fluence being equal to or larger than a threshold at or beyond which ablation potentially occurs to the impurity source film when the irradiation object is irradiated with the pulse laser beam in the same number of pulses as the first irradiation pulse number and smaller than a threshold at or beyond which damage potentially occurs to the surface of the semiconductor substrate;

calculating a first scanning speed $Vdx$ based on Expression (e) below when $Bx$ represents the width of the irradiation region in a scanning direction, $Nd$ represents the first irradiation pulse number, and $f$ represents the repetition frequency of the pulse laser beam; and moving the irradiation object at the first scanning speed $Vdx$ relative to the irradiation region while irradiating the irradiation region with the pulse laser beam at the repetition frequency $f$.

$$Vdx = f \cdot Bx / Nd \tag{e}$$

BRIEF DESCRIPTION OF THE DRAWINGS

Embodiments of the present disclosure will be described below as examples with reference to the accompanying drawings.

FIG. 14 is a flowchart illustrating processing of laser doping control performed by the laser irradiation control unit.

DESCRIPTION OF EMBODIMENTS

Figure 1:
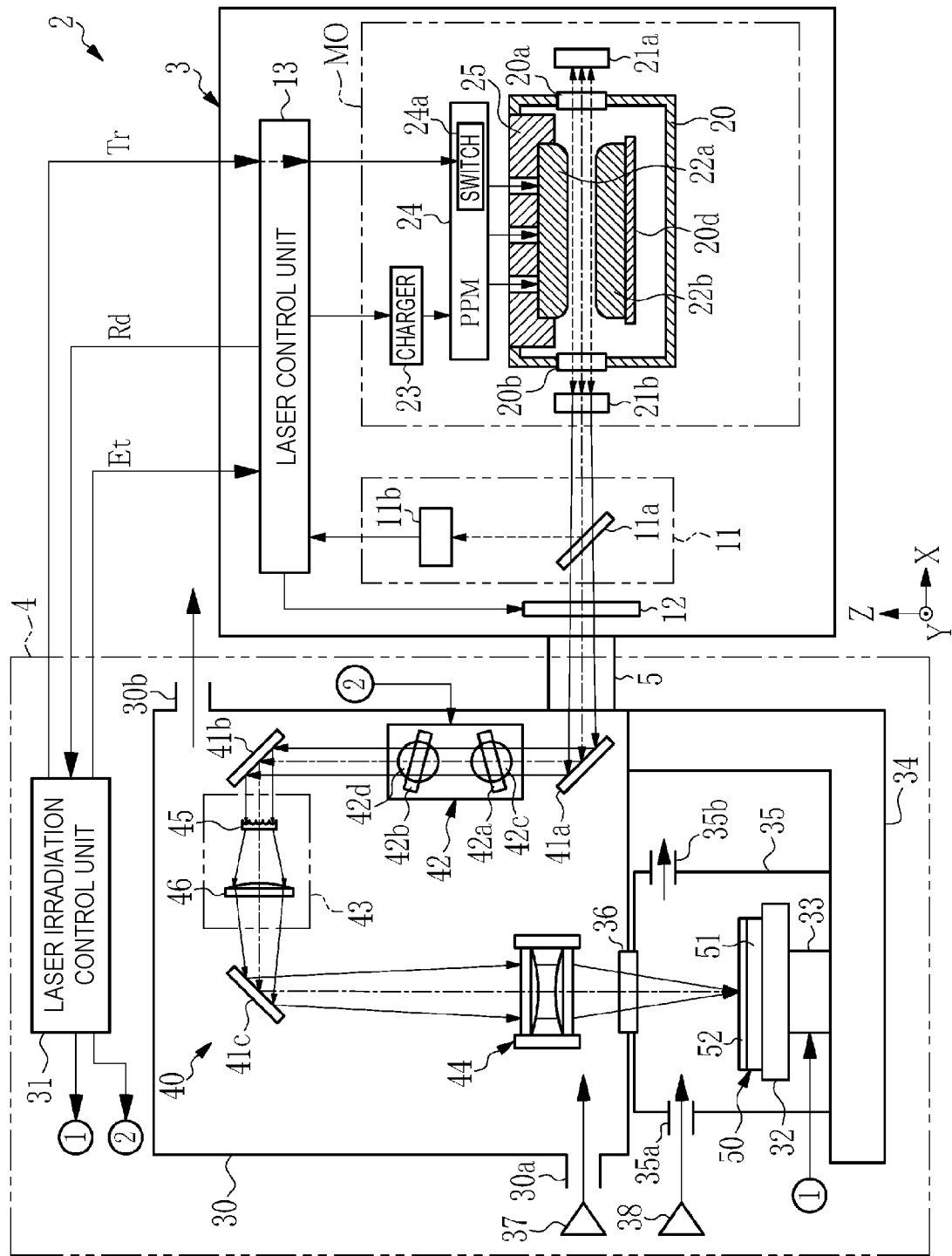
FIG. 1 is a diagram schematically illustrating the configuration of a laser irradiation system according to a comparative example.

<Contents>
1. Overview
2. Comparative example
2.1 Configuration of laser irradiation system
2.2 Laser irradiation control
2.3 Set value of attenuator transmittance
2.4 Operation of laser irradiation system
2.4.1 Main flow
2.4.2 Details of S110
2.4.3 Details of S120
2.4.4 Details of S150
2.4.5 Details of S160
2.5 Problem
3. First Embodiment
3.1 Configuration
3.2 Scanning irradiation control
3.3 Set value of pulse laser beam fluence
3.4 Operation of laser irradiation system
3.4.1 Main flow
3.4.2 Details of S210
3.4.3 Details of S250
3.4.4 Details of S260
3.4.5 Details of S270
3.5 Effect
3.6 Specific example of semiconductor substrate made of SiC 4. Second Embodiment
4.1 Configuration
4.2 Scanning irradiation control
4.3 Set value of pulse laser beam fluence
4.4 Set value of attenuator transmittance
4.5 Operation of laser irradiation system
4.5.1 Main flow
4.5.2 Details of S310
4.5.3 Details of S350
4.5.4 Details of S360
4.5.5 Details of S410
4.6 Effect
4.7 Specific example of parameters
4.8 Aspect ratio of irradiation region
4.9 Kind of laser apparatus
5. First modification
5.1 Scanning irradiation control
5.2 Operation of laser irradiation system
5.3 Effect
6. Second modification
7. Modification of laser apparatus
8. Other modifications Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview

The present disclosure relates to a laser irradiation system configured to dope a semiconductor substrate with impurities by irradiating an irradiation object in which an impurity source film is formed on the semiconductor substrate with a pulse laser beam.

2. Comparative Example 2.1 Configuration of Laser Irradiation System

FIG. 1 schematically illustrates the configuration of a laser irradiation system 2 according to a comparative example. The laser irradiation system 2 includes a laser apparatus 3 and a laser irradiation device 4. The laser apparatus 3 and the laser irradiation device 4 are connected with each other through an optical path pipe 5.

The laser apparatus 3 includes a master oscillator MO, a monitor module 11, a shutter 12, and a laser control unit 13. The laser apparatus 3 is a discharge-pumped amplifier laser apparatus configured to generate a pulse laser beam in the ultraviolet region by using, as a laser medium, laser gas containing $F_2$, ArF, KrF, XeCl, or XeF.

When the laser apparatus 3 is a $F_2$ laser apparatus, the central wavelength of the pulse laser beam is 157 nm approximately. When the laser apparatus 3 is an ArF excimer laser apparatus, the central wavelength of the pulse laser beam is 193.4 nm approximately. When the laser apparatus 3 is a KrF excimer laser apparatus, the central wavelength of the pulse laser beam is 248.4 nm approximately. When the laser apparatus 3 is a XeCl excimer laser apparatus, the central wavelength of the pulse laser beam is 308 nm approximately. When the laser apparatus 3 is a XeF excimer laser apparatus, the central wavelength of the pulse laser beam is 351 nm approximately.

The master oscillator MO includes a laser chamber 20, a rear mirror 21a, an output coupling mirror 21b, a charger 23, and a pulse power module (PPM) 24. FIG. 1 illustrates the internal configuration of the laser chamber 20 when viewed in a direction substantially orthogonal to the traveling direction of the laser beam.

The laser chamber 20 is a chamber in which the laser gas is encapsulated and a pair of electrodes 22a and 22b are disposed. The electrodes 22a and 22b are discharge electrodes for exciting the laser medium through electrical discharging.

An opening is formed at the laser chamber 20 and blocked by an electric insulation unit 25. The electrode 22a is supported to the electric insulation unit 25, and the electrode 22b is supported to a return plate 20d. The return plate 20d is connected with the inner surface of the laser chamber 20 through a wire (not illustrated). The electric insulation unit 25 includes an embedded conduction part. High voltage supplied from the PPM 24 is applied to the electrode 22a through the conduction part.

The charger 23 is a direct-current power source device configured to charge a charging capacitor (not illustrated) in the PPM 24 at a predetermined voltage. The PPM 24 includes a switch 24a controlled by the laser control unit 13. When the switch 24a transitions from an ON state to an OFF state, the PPM 24 generates high voltage in pulses from electric energy held at the charger 23, and applies the high voltage between the electrodes 22a and 22b.

When the high voltage is applied between the electrodes 22a and 22b, insulation between the electrodes 22a and 22b is broken down and electrical discharging occurs. The laser medium in the laser chamber 20 is excited by the energy of the electrical discharging and transitions to a higher energy level. Thereafter, when transitioning to a lower energy level, the excited laser medium discharges light in accordance with the energy level difference between the levels.

Windows 20a and 20b are provided at both ends of the laser chamber 20. The light generated in the laser chamber 20 is emitted out of the laser chamber 20 through the windows 20a and 20b.

The rear mirror 21a and the output coupling mirror 21b form an optical resonator. The rear mirror 21a is coated with a high reflection film, and the output coupling mirror 21b is coated with a partial reflection film. The laser chamber 20 is disposed on the optical path of the optical resonator. Accordingly, the rear mirror 21a highly reflects light output from inside the laser chamber 20 through the window 20a and returns the light into the laser chamber 20 through the window 20a. The output coupling mirror 21b transmits part of light output from inside the laser chamber 20 through the window 20b and reflects other part back into the laser chamber 20.

Accordingly, light emitted from the laser chamber 20 reciprocates between the rear mirror 21a and the output coupling mirror 21b, and is amplified each time the light passes through an electrical discharging space between the electrode 22a and the electrode 22b. Part of the amplified light is output as the pulse laser beam through the output coupling mirror 21b.

The monitor module 11 is disposed on the optical path of the pulse laser beam emitted from the master oscillator MO. The monitor module 11 includes, for example, a beam splitter 11a and an optical sensor 11b. The beam splitter 11a transmits, toward the shutter 12 at high transmittance, the pulse laser beam output from the master oscillator MO and reflects part of the pulse laser beam toward the optical sensor 11b. The optical sensor 11b detects the pulse energy of the incident pulse laser beam and outputs data of the detected pulse energy to the laser control unit 13.

The laser control unit 13 transmits and receives various signals to and from a laser irradiation control unit 31 included in the laser irradiation device 4. For example, the laser control unit 13 receives data of a light emission trigger Tr and a target pulse energy Et and the like from the laser irradiation control unit 31. The laser control unit 13 transmits a charge voltage setting signal to the charger 23 and transmits a command signal for turning on or off the switch 24a to the PPM 24.

The laser control unit 13 receives the pulse energy data from the monitor module 11 and controls the charge voltage of the charger 23 by referring to the received pulse energy data. Through the control of the charge voltage of the charger 23, the pulse energy of the pulse laser beam is controlled.

The shutter 12 is disposed on the optical path of the pulse laser beam having transmitted through the beam splitter 11a of the monitor module 11. The laser control unit 13 closes the shutter 12 until the difference between the pulse energy received from the monitor module 11 and the target pulse energy Et becomes within an allowable range after start of laser oscillation. The laser control unit 13 opens the shutter 12 when the difference between the pulse energy received from the monitor module 11 and the target pulse energy Et becomes within the allowable range. In synchronization with a signal for opening the shutter 12, the laser control unit 13 transmits a preparation complete signal Rd indicating that reception of the light emission trigger Tr for the pulse laser beam is possible to the laser irradiation control unit 31.

The laser irradiation device 4 includes a housing 30, the laser irradiation control unit 31, a table 32, an XYZ stage 33, a frame 34, an irradiation shield 35, and an optical system 40. The optical system 40 is disposed in the housing 30. The housing 30, the XYZ stage 33, and the irradiation shield 35 are fixed to the frame 34.

An irradiation object 50 to be irradiated with the pulse laser beam from the laser irradiation device 4 is placed on the table 32. The irradiation object 50 is a semiconductor material used for a power device, such as SiC, diamond, or GaN. The crystal structure of SiC is not particularly limited but is, for example, 4H—SiC. The irradiation object 50 includes a semiconductor substrate 51 made of the semiconductor material, and an impurity source film 52 formed on the surface of the semiconductor substrate 51. The impurity source film 52 contains at least an impurity element as a dopant.

To produce the semiconductor substrate 51 of the p type by doping, for example, an aluminum metal film containing an aluminum element as a p-type dopant is used as the impurity source film 52. To produce the semiconductor substrate 51 of the n type by doping, for example, a nitride film such as a SiN film containing a nitrogen element as an n-type dopant is used as the impurity source film 52.

The XYZ stage 33 supports the table 32 to be freely movable. The XYZ stage 33 moves the table 32 in an X axial direction, a Y axial direction, and a Z axial direction in accordance with a control signal input from the laser irradiation control unit 31. As the position of the table 32 is changed in the X axial direction or the Y axial direction by the XYZ stage 33, a region irradiated with the pulse laser beam on the surface of the irradiation object 50 is changed. The Z axial direction is parallel to the optical axis of the pulse laser beam output from the optical system 40. The X and Y axial directions are orthogonal to each other and orthogonal to the Z axial direction.

The optical system 40 includes high reflectance mirrors 41a to 41c, an attenuator 42, a beam homogenizer 43, and a transfer optical system 44. The high reflectance mirrors 41a to 41c reflect the pulse laser beam in the ultraviolet region at high reflectance. The high reflectance mirror 41a is disposed to reflect the pulse laser beam incident from the laser apparatus 3 through the optical path pipe 5 so that the reflected pulse laser beam passes through the attenuator 42 and is incident on the high reflectance mirror 41b. The high reflectance mirrors 41a to 41c are each formed by coating the surface of a transparent substrate made of, for example, synthetic quartz or calcium fluoride ($CaF_2$) crystal with a reflective film that highly reflects the pulse laser beam.

The attenuator 42 is disposed on the optical path between the high reflectance mirror 41a and the high reflectance mirror 41b. The attenuator 42 includes two partially reflective mirrors 42a and 42b and rotation stages 42c and 42d and has a variable transmittance. The rotation stage 42c holds and rotates the partially reflective mirror 42a to change the incident angle of the pulse laser beam on the partially reflective mirror 42a. The rotation stage 42d holds and rotates the partially reflective mirror 42b to change the incident angle of the pulse laser beam on the partially reflective mirror 42b.

The partially reflective mirrors 42a and 42b are each an optical element having a transmittance that changes in accordance with the incident angle of the pulse laser beam. The tilt angles of the partially reflective mirrors 42a and 42b are adjusted by the rotation stages 42c and 42d so that the mirrors have the same incident angle of the pulse laser beam and a desired transmittance.

The rotation stages 42c and 42d are driven to control the transmittance of the attenuator 42 by a control signal input from the laser irradiation control unit 31. The pulse laser beam incident on the attenuator 42 is dimmed in accordance with the transmittance controlled based on the control signal and is output from the attenuator 42.

The high reflectance mirror 41b is disposed to reflect the pulse laser beam incident from the attenuator 42 so that the reflected pulse laser beam passes through the beam homogenizer 43 and is incident on the high reflectance mirror 41c.

The beam homogenizer 43 is disposed on the optical path between the high reflectance mirror 41b and the high reflectance mirror 41c. The beam homogenizer 43 includes a fly-eye lens 45 and a condenser lens 46. The fly-eye lens 45 is disposed upstream of the condenser lens 46. The pulse laser beam incident from the high reflectance mirror 41b transmits through the fly-eye lens 45 and the condenser lens 46 and is subjected to Koehler illumination at the focal point plane of the condenser lens 46, thereby obtaining homogeneous light intensity distribution in a predetermined beam shape. The fly-eye lens 45 shapes the pulse laser beam to have a rectangular beam shape at a section orthogonal to the optical axis. In this manner, the pulse laser beam output from the fly-eye lens 45 is subjected to Koehler illumination at the focal point plane of the condenser lens 46 through the condenser lens 46 and incident on the high reflectance mirror 41c.

The transfer optical system 44 is disposed on the optical path of the pulse laser beam reflected by the high reflectance mirror 41c. The transfer optical system 44 is formed by combining a plurality of lenses. The transfer optical system 44 may be a reduced projection optical system. The transfer optical system 44 transfers the rectangular beam formed through the beam homogenizer 43 onto the surface of the irradiation object 50 through window 36.

The window 36 is disposed on the optical path between the transfer optical system 44 and the irradiation object 50 and sealed and fixed to an opening formed at the housing 30 through an O ring (not illustrated). The window 36 is a transparent substrate made of synthetic quartz or $CaF_2$ crystal, and both surfaces thereof may be each coated with a reflection suppression film.

The housing 30 is provided with an intake port 30a through which first purge gas is taken into the housing 30, and a discharge port 30b through which the first purge gas is discharged out of the housing 30. The first purge gas is, for example, nitrogen ($N_2$) gas. The intake port 30a and the discharge port 30b are connected with an intake pipe and a discharge pipe (not illustrated). The intake port 30a and the discharge port 30b connected with the intake pipe and the discharge pipe are sealed by O rings (not illustrated) to prevent mixture of external air into the housing 30. The intake port 30a is connected with a first purge gas supply source 37 configured to supply the first purge gas. The inside of the housing 30 is purged by the first purge gas.

A connection part between the optical path pipe 5 and the laser irradiation device 4 and a connection part between the optical path pipe 5 and the laser apparatus 3 are each sealed by an O ring (not illustrated). The inside of the optical path pipe 5 is purged by the first purge gas.

The irradiation shield 35 encloses the irradiation object 50 supported by the table 32. The irradiation shield 35 has a size enough to entirely enclose the table 32 and the XYZ stage 33 and is fixed to the frame 34. An opening connected with the window 36 provided to the housing 30 is formed at the upper surface of the irradiation shield 35. The space between the opening and the window 36 is sealed by an O ring (not illustrated).

The irradiation shield 35 allows the space between the window 36 and the irradiation object 50 to be filled with second purge gas. The irradiation shield 35 is provided with an intake port 35a through which the second purge gas is taken into the irradiation shield 35, and a discharge port 35b through which the second purge gas is discharged out of the irradiation shield 35. The second purge gas is inert gas containing substantially no oxygen and is, for example, argon gas (Ar) or helium gas (He). The second purge gas may be inert gas containing oxygen of a concentration with which no oxide is generated on the semiconductor surface when the semiconductor material is irradiated with the laser beam. The intake port 35a is connected with a second purge gas supply source 38 configured to supply the second purge gas. The inside of the irradiation shield 35 is purged by the second purge gas.

The laser irradiation control unit 31 outputs the light emission trigger Tr to the laser control unit 13 at a predetermined repetition frequency f. The master oscillator MO performs laser oscillation at the repetition frequency f in accordance with the light emission trigger Tr. The laser irradiation control unit 31 includes a memory unit (not illustrated) storing an irradiation condition of a laser-doping beam. The irradiation condition includes fluence Fd per pulse of the laser-doping beam as a pulse laser beam with which the irradiation object 50 is irradiated at laser doping. The laser irradiation control unit 31 calculates a laser-doping transmittance Td of the attenuator 42 based on the value of the fluence Fd.

The laser irradiation control unit 31 controls the XYZ stage 33 to perform laser irradiation of one pulse for each chip formation region by a step-and-repeat scheme. Details of the above will be described below.

2.2 Laser Irradiation Control

Figure 2A:
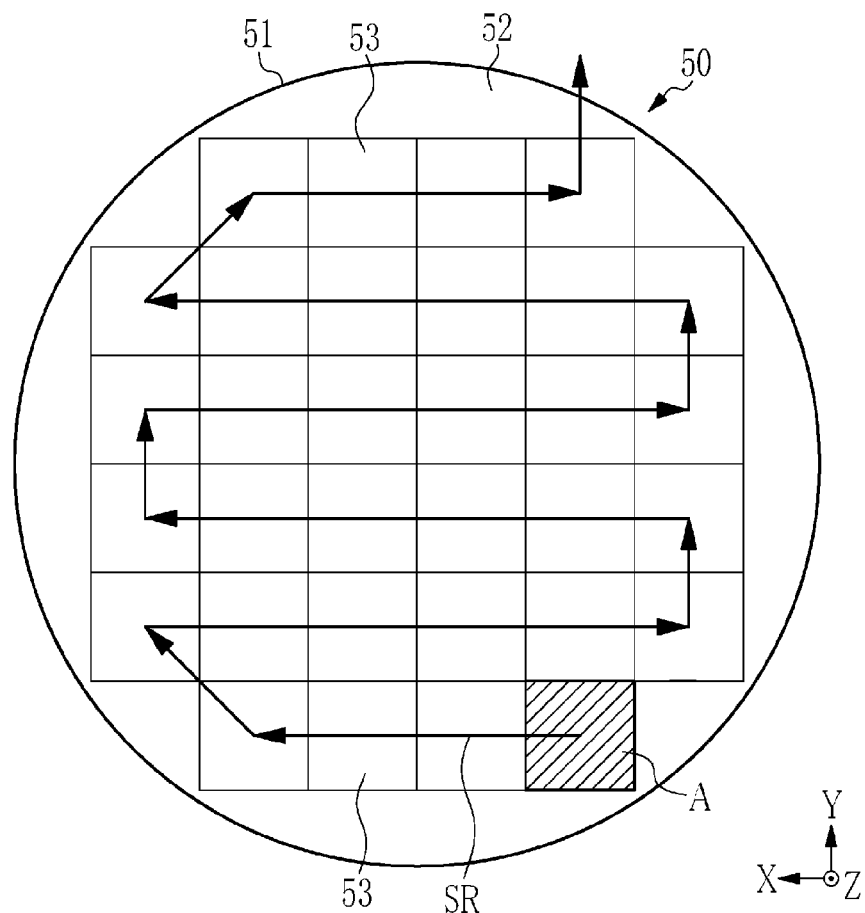
FIG. 2A is a diagram for description of irradiation control by a step-and-repeat scheme in a first embodiment.

The following describes laser irradiation control by the step-and-repeat scheme performed by the laser irradiation control unit 31. FIG. 2A illustrates the irradiation object 50 obtained by forming the semiconductor substrate 51 into a wafer shape. A plurality of chip formation regions 53 are two-dimensionally arrayed on the semiconductor substrate 51 in the X and Y axial directions. Each chip formation region 53 has a rectangular shape. The chip formation region 53 is a minimum region for cutting the semiconductor substrate 51 into chips.

Figure 2B:
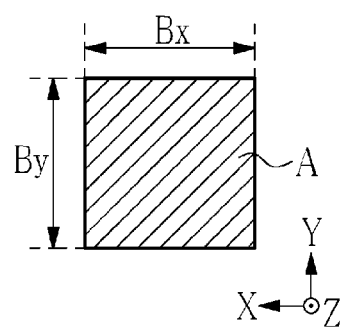
FIG. 2B is a diagram illustrating the shape of an irradiation region.

In FIG. 2A, reference sign A indicates the beam shape, in other words, irradiation region of the pulse laser beam incident on the irradiation object 50 from the beam homogenizer 43 through the high reflectance mirror 41c and the transfer optical system 44. As illustrated in FIG. 2B, the irradiation region A has a rectangular shape with a first beam width Bx in the X axial direction and a second beam width By in the Y axial direction. The first beam width Bx is equal to the length of each chip formation region 53 in the X axial direction. The second beam width By is equal to the length of each chip formation region 53 in the Y axial direction.

The laser irradiation control unit 31 sets the irradiation region A of the pulse laser beam to a desired chip formation region 53 by controlling the XYZ stage 33 to relatively move the irradiation object 50 in the X and Y axial directions. Reference sign SR indicates a path on which the irradiation region A moves as the XYZ stage 33 is controlled to move the irradiation object 50. The laser irradiation control unit 31 causes the laser apparatus 3 to perform one-pulse laser irradiation each time the irradiation region A is positioned at each chip formation region 53 by the step-and-repeat scheme.

2.3 Set Value of Attenuator Transmittance

The following describes a set value of the transmittance of the attenuator 42 for setting the fluence of the pulse laser beam to be a predetermined value. T represents the transmittance of the attenuator 42, and T' represents transmittance on the optical path from the attenuator 42 to the irradiation object 50. In addition, Et represents the pulse energy of the pulse laser beam incident on the attenuator 42, and F represents the fluence of the pulse laser beam on the surface of the irradiation object 50. In this case, the fluence F is expressed by Expression (1) below.

$$F = T \cdot T' \cdot Et/(Bx \cdot By) \tag{1}$$

In the present comparative example, for example, it is assumed that the transmittance T' is 100%, in other words, T' is equal to one. In this case, the transmittance T of the attenuator 42 is expressed by Expression (2) below.

$$T = (F/Et)(Bx \cdot By) \tag{2}$$

The laser irradiation control unit 31 calculates the laser-doping transmittance Td by substituting the value of the fluence Fd included in the above-described irradiation condition into Expression (2) above. When the transmittance T' has a constant value smaller than one, the transmittance T may be calculated based on Expression (3) below.

$$T = (F/(Et \cdot T'))(Bx \cdot By) \tag{3}$$

2.4 Operation of Laser Irradiation System 2.4.1 Main Flow

Figure 3:
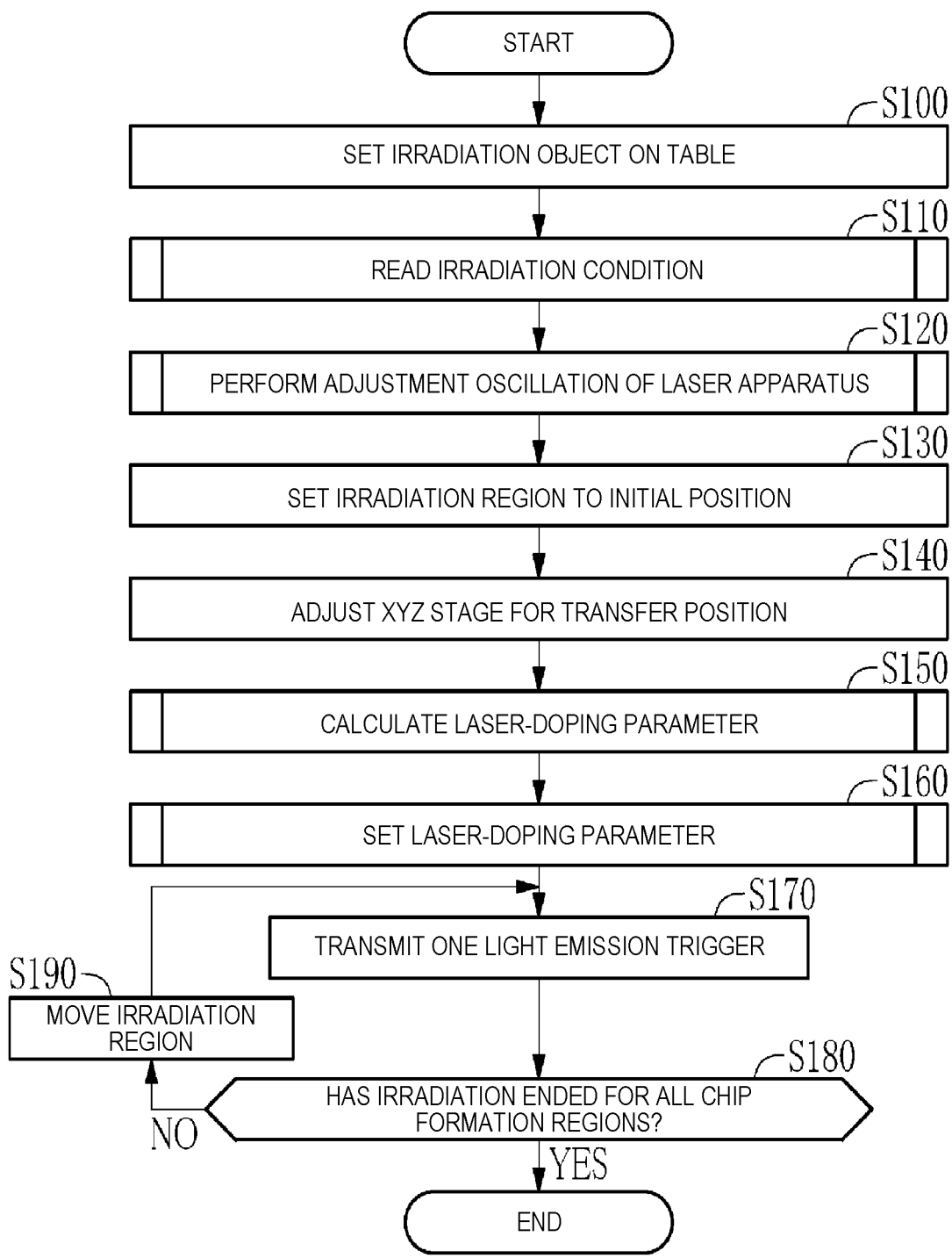
FIG. 3 is a flowchart illustrating processing of laser doping control performed by a laser irradiation control unit.

FIG. 3 is a flowchart illustrating processing of laser doping control performed by the laser irradiation control unit 31. The laser irradiation control unit 31 operates the laser irradiation system 2 through processing described below.

When the irradiation object 50 is set on the table 32 (step S100), the laser irradiation control unit 31 reads a laser-doping irradiation condition from the memory unit (step S110). This irradiation condition includes the laser-doping fluence Fd.

Subsequently, the laser irradiation control unit 31 causes the laser apparatus 3 to perform adjustment oscillation (step S120). When the adjustment oscillation is completed, the laser irradiation control unit 31 controls the XYZ stage 33 to set the irradiation region A of the pulse laser beam to an initial position at one chip formation region 53 illustrated in FIG. 2A (step S130). In addition, the laser irradiation control unit 31 adjusts the XYZ stage 33 in the Z axial direction so that the surface of the irradiation object 50 coincides with the transfer position of, through the transfer optical system 44, the beam shaped into a rectangular shape on the focal point plane of the condenser lens 46 of the beam homogenizer 43 (step S140).

Subsequently, the laser irradiation control unit 31 calculates a laser-doping parameter (step S150). The laser-doping parameter includes the laser-doping transmittance Td of the attenuator 42.

The laser irradiation control unit 31 sets the laser-doping parameter to the laser irradiation device 4 (step S160). Then, the laser irradiation control unit 31 transmits the light emission trigger Tr to the laser apparatus 3 and causes the laser apparatus 3 to output the pulse laser beam (step S170). The laser irradiation control unit 31 determines whether the irradiation has ended for all chip formation regions 53 each time the irradiation region A is irradiated with one pulse of the pulse laser beam (step S180).

When the irradiation has not ended for all chip formation regions 53 (NO at step S180), the laser irradiation control unit 31 controls the XYZ stage 33 to move the irradiation region A to the next chip formation region 53 along the path SR (step S190). The laser irradiation control unit 31 repeats steps S170 to S190 until the irradiation ends for all chip formation regions 53. When the irradiation has ended for all chip formation regions 53 (YES at step S180), the laser irradiation control unit 31 ends the laser doping control.

2.4.2 Details of S110

Figure 4:
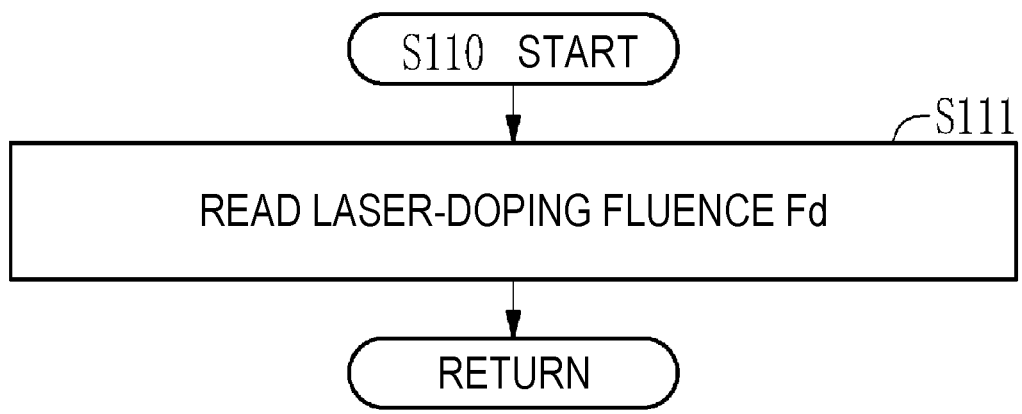
FIG. 4 illustrates a detailed subroutine of processing of reading an irradiation condition.

FIG. 4 illustrates a detailed subroutine of the processing (step S110) of reading the irradiation condition in the main flow illustrated in FIG. 3. In the present comparative example, at step S110, the laser irradiation control unit 31 reads the fluence Fd as the laser-doping irradiation condition from the memory unit (step S111). Thereafter, the laser irradiation control unit 31 returns the processing to the main flow.

2.4.3 Details of S120

Figure 5:
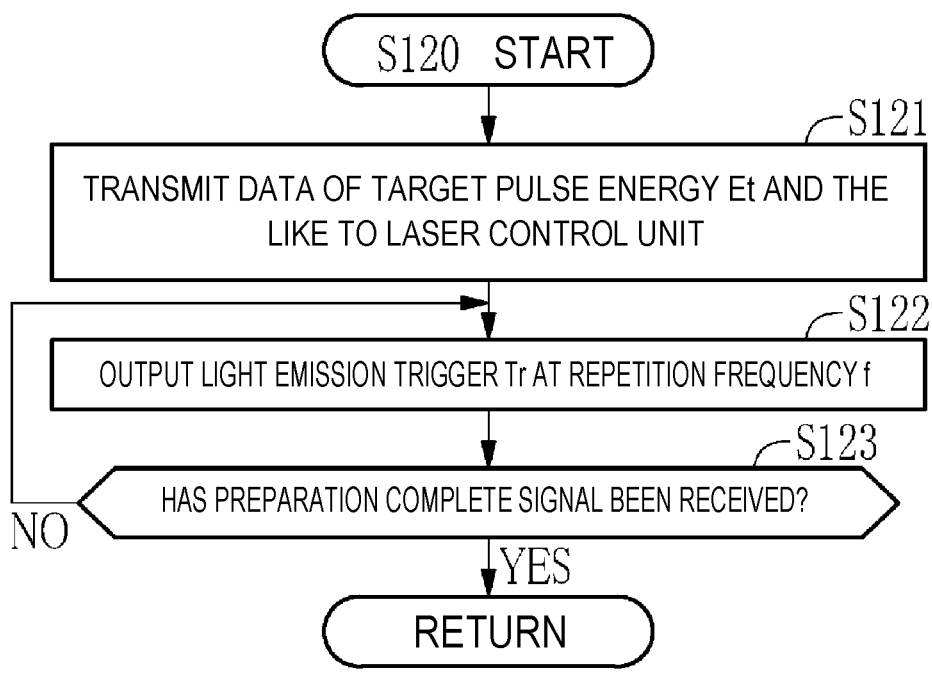
FIG. 5 illustrates a detailed subroutine of processing of causing a laser apparatus to perform adjustment oscillation.

FIG. 5 illustrates a detailed subroutine of the processing (step S120) of causing the laser apparatus 3 to perform adjustment oscillation in the main flow illustrated in FIG. 3. At step S120, first, the laser irradiation control unit 31 transmits data of the target pulse energy Et and the like to the laser control unit 13 (step S121). The target pulse energy Et is, for example, 1 J.

Thereafter, the laser irradiation control unit 31 outputs the light emission trigger Tr to the laser control unit 13 at the repetition frequency f (step S122). Then, the laser irradiation control unit 31 determines whether the preparation complete signal Rd has been received from the laser control unit 13 (step S123). When the preparation complete signal Rd has not been received (NO at step S123), the laser irradiation control unit 31 returns to step S122. When having received the preparation complete signal Rd (YES at step S123), the laser irradiation control unit 31 returns the processing to the main flow. The repetition frequency f is substantially equal to a repetition frequency for exposure by the step-and-repeat scheme, and has a fixed value of, for example, 0.5 Hz to 5 Hz inclusive.

2.4.4 Details of S150

Figure 6:
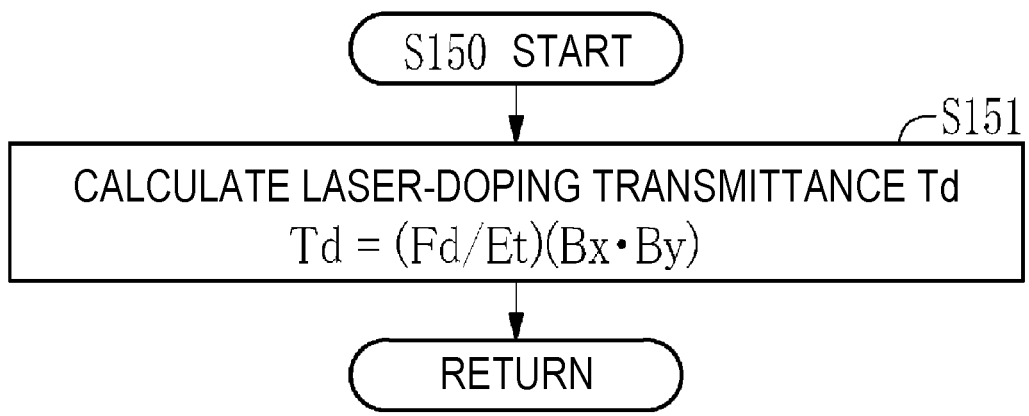
FIG. 6 illustrates a detailed subroutine of processing of calculating a laser-doping parameter.

FIG. 6 illustrates a detailed subroutine of the processing of calculating the laser-doping parameter (step S150) in the main flow illustrated in FIG. 3. In the present comparative example, at step S150, the laser irradiation control unit 31 calculates the laser-doping transmittance Td of the attenuator 42 based on Expression (2) above by using data of the fluence Fd read at step S111 (step S151). Thereafter, the laser irradiation control unit 31 returns the processing to the main flow.

2.4.5 Details of S160

Figure 7:
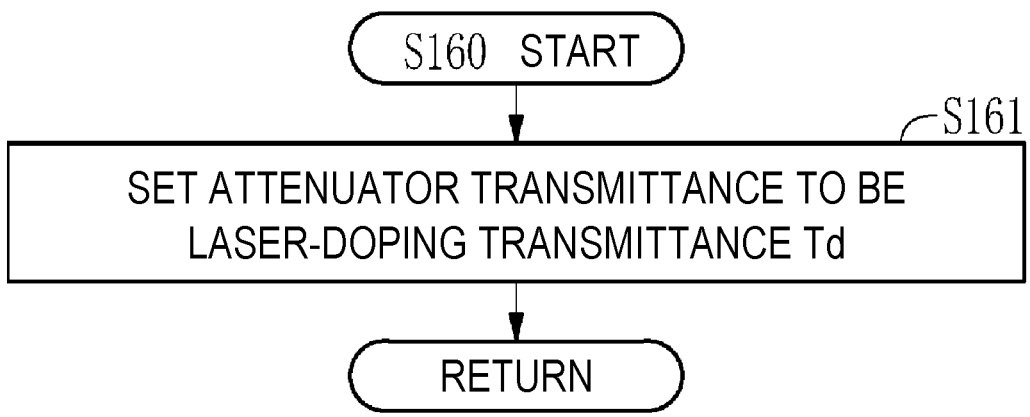
FIG. 7 illustrates a detailed subroutine of processing of setting the laser-doping parameter.

FIG. 7 illustrates a detailed subroutine of the processing of setting the laser-doping parameter (step S160) in the main flow illustrated in FIG. 3. In the present comparative example, at step S160, the laser irradiation control unit 31 sets the transmittance of the attenuator 42 to be the transmittance Td calculated at step S151 (step S161). Specifically, the laser irradiation control unit 31 sets the rotation stages 42c and 42d included in the attenuator 42 so that the transmittance of the attenuator 42 is equal to the transmittance Td. Thereafter, the laser irradiation control unit 31 returns the processing to the main flow.

2.5 Problem

Figure 8:
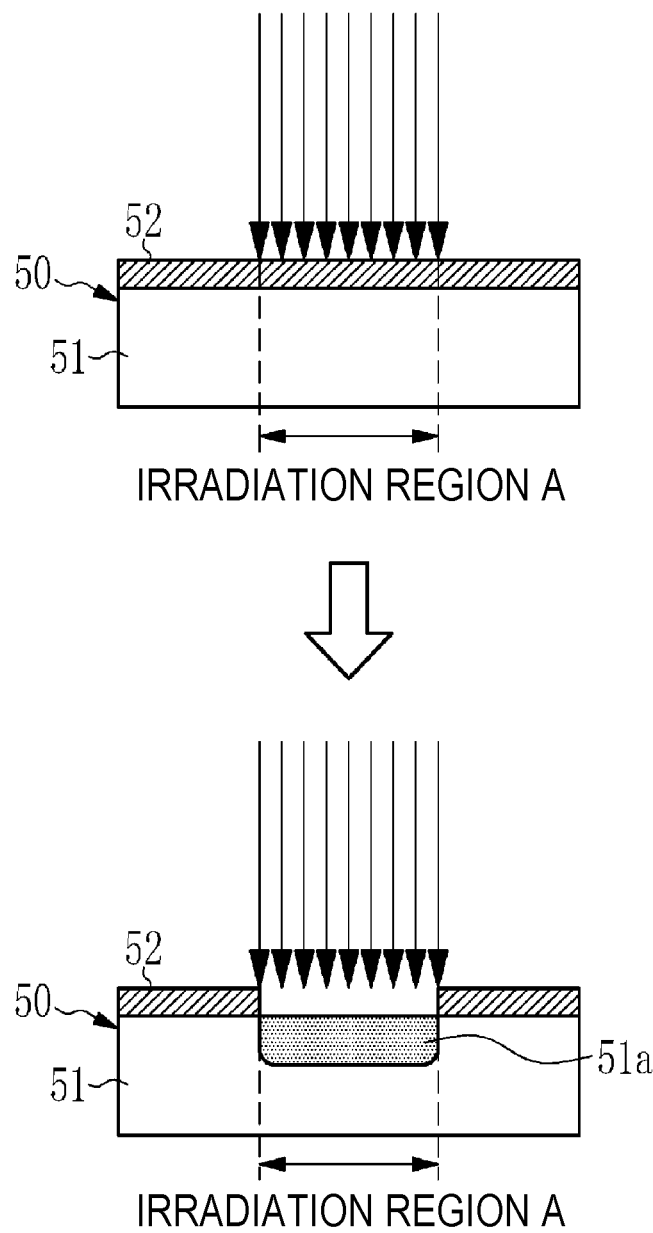
FIG. 8 is a diagram (1) for description of problems of the comparative example.
Figure 9:
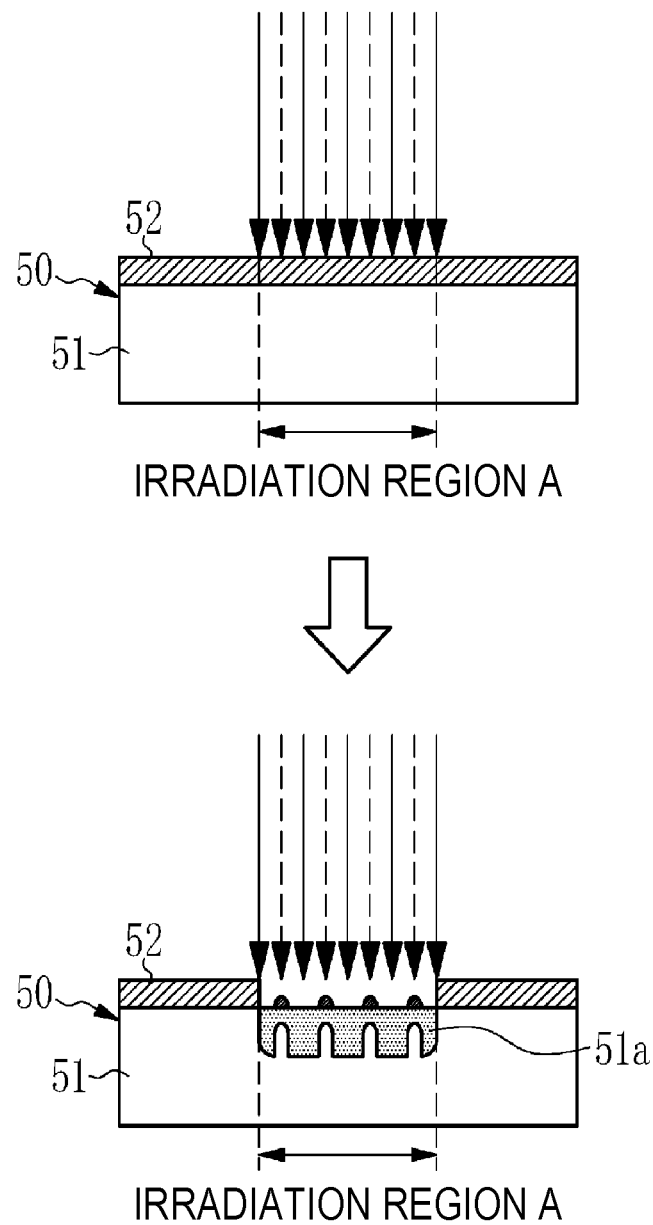
FIG. 9 is a diagram (2) for description of problems of the comparative example.
Figure 10:
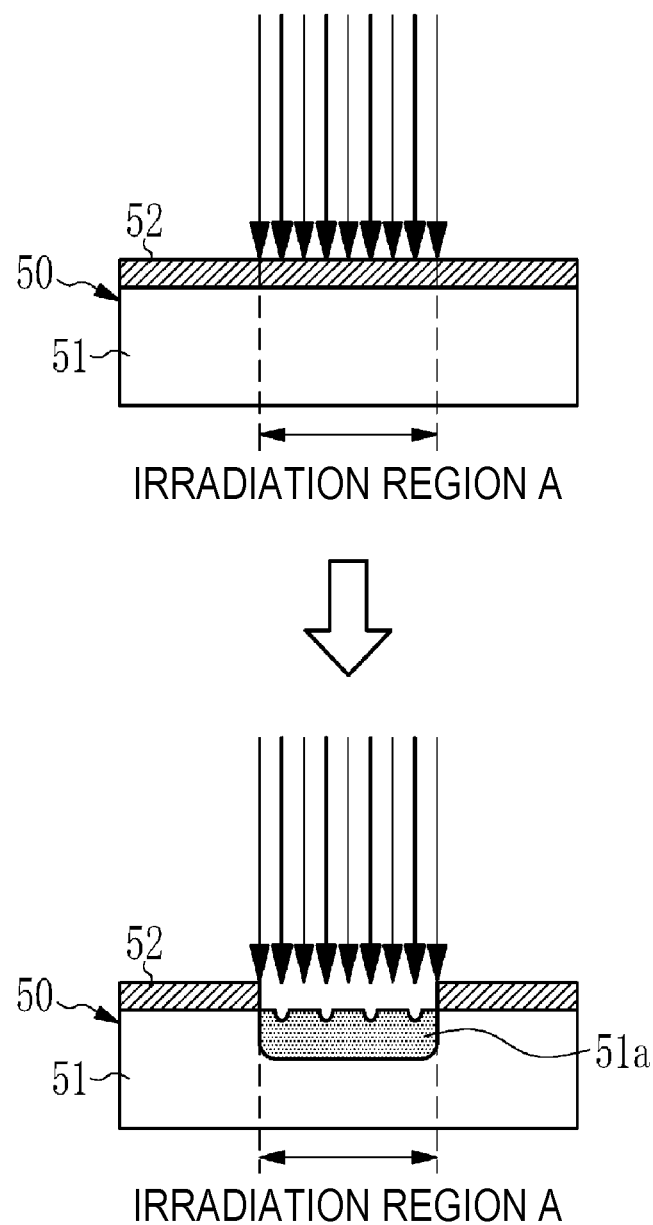
FIG. 10 is a diagram (3) for description of problems of the comparative example.

The following describes problems of the laser irradiation system 2 according to the comparative example with reference to FIGS. 8 to 10. FIGS. 8 to 10 each illustrate a situation in which a doping region 51a is formed when the irradiation region A set on the surface of the irradiation object 50 is irradiated with one pulse of the pulse laser beam having photon energy higher than the bandgap energy of the semiconductor substrate 51.

FIG. 8 illustrates the doping region 51a formed when the light intensity of the pulse laser beam with which the impurity source film 52 is irradiated is highly homogeneous and the fluence thereof is in an optimum range. In this case, the impurity source film 52 in the irradiation region A is subjected to ablation with one pulse of the pulse laser beam and completely removed. Accordingly, in the semiconductor substrate 51, a region corresponding to the irradiation region A is homogeneously doped with impurities and formed as the doping region 51a that is homogeneous.

FIG. 9 illustrates the doping region 51a formed when the light intensity of the pulse laser beam with which the impurity source film 52 is irradiated is not homogeneous and the fluence of part of the pulse laser beam is lower than that in the optimum range. In FIG. 9, each arrow illustrated with a dashed line represents the pulse laser beam having fluence lower than that in the optimum range. In this case, part of the impurity source film 52 does not ablate but remains at a part where the fluence is low. Accordingly, the depth of doping in the doping region 51a partially becomes shallow. As a result, a formed chip potentially does not normally function as a device.

FIG. 10 illustrates the doping region 51a formed when the light intensity of the pulse laser beam with which the impurity source film 52 is irradiated is not homogeneous and the fluence of part of the pulse laser beam is higher than that in the optimum range. In FIG. 10, each arrow illustrated with a bold solid line represents the pulse laser beam having fluence higher than that in the optimum range. In this case, at a part where the fluence is high, the impurity source film 52 is removed through ablation and the surface of the semiconductor substrate 51 is irradiated with the pulse laser beam. Accordingly, the surface of the semiconductor substrate 51 is partially damaged. As a result, a formed chip potentially does not normally function as a device.

The irradiation region A can be irradiated with a plurality of pulses of the pulse laser beam to completely remove the impurity source film 52 in the irradiation region A, but in this case, the surface of the semiconductor substrate 51 is potentially damaged by the second or later pulse of the pulse laser beam.

As described above, the impurity source film 52 needs to be efficiently removed by one pulse of the pulse laser beam when laser doping is performed with the laser irradiation system 2 according to the comparative example, which causes problems as follows. For example, when the semiconductor substrate 51 is a power semiconductor, fluence optimum for laser doping is several $J/cm^2$ approximately. Irradiation of the entire irradiation region at this fluence requires a laser apparatus capable of outputting a pulse laser beam having a pulse energy of 1 J or larger. Thus, a conventional laser apparatus having a small pulse energy of 30 mJ to 400 mJ cannot be used to appropriately perform laser doping.

In addition, a laser apparatus having high stability of pulse energy is needed to appropriately perform laser doping. In addition, a laser apparatus configured to output a pulse laser beam having a stable beam shape and a laser irradiation device configured to homogenize the beam are needed to increase homogeneity of the light intensity in the irradiation region. In addition, a laser apparatus having high stability of pulse energy at a low repetition frequency is needed.

To solve these problems, laser doping is performed by moving the irradiation object relative to the irradiation region at a constant scanning speed while irradiating the irradiation region with a pulse laser beam at a constant repetition frequency in embodiments described below.

3. First Embodiment

3.1 Configuration

Figure 11:
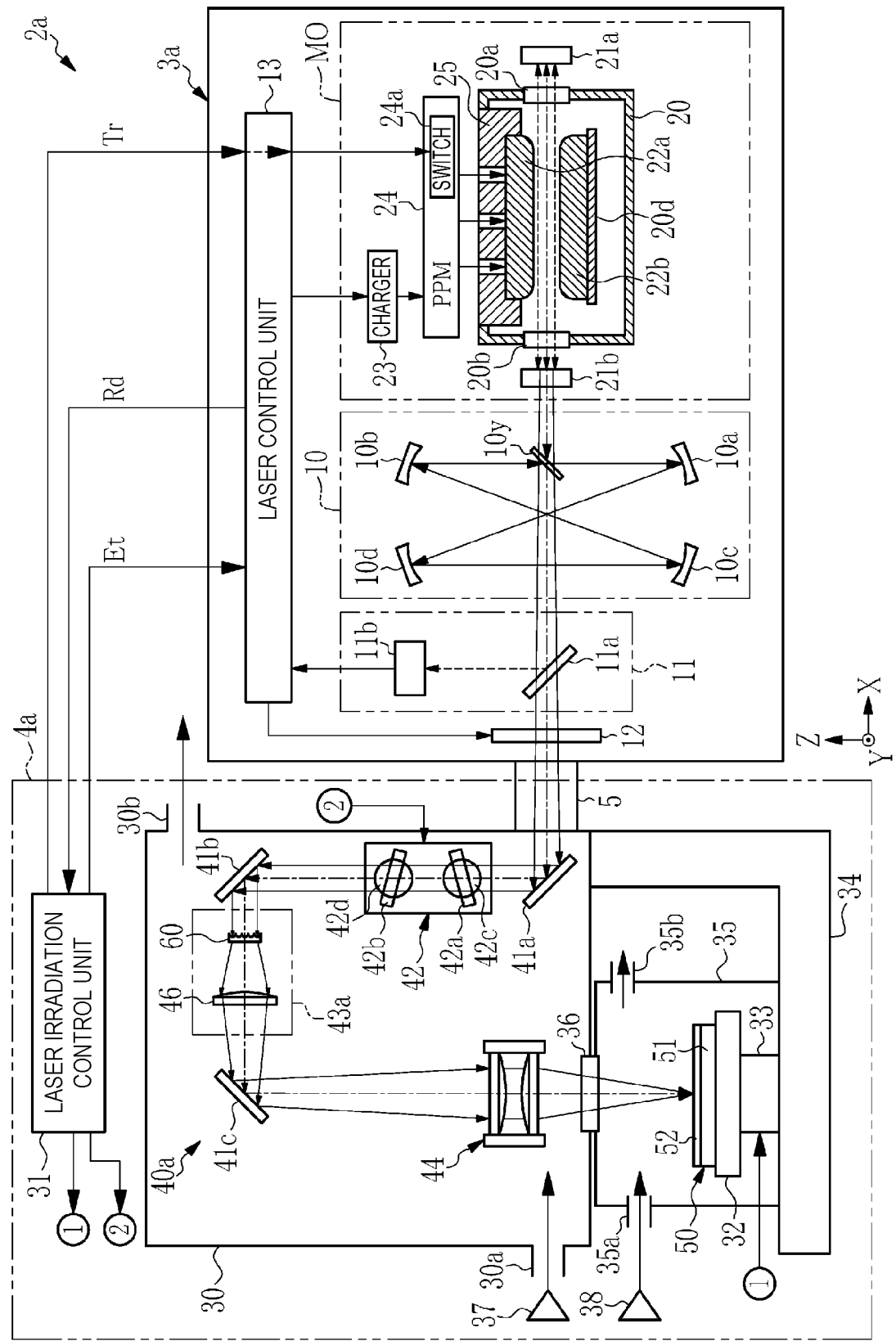
FIG. 11 is a diagram schematically illustrating the configuration of a laser irradiation system according to the first embodiment.

FIG. 11 schematically illustrates the configuration of a laser irradiation system 2a according to a first embodiment of the present disclosure. The laser irradiation system 2a according to the first embodiment includes a laser apparatus 3a in place of the laser apparatus 3 included in the laser irradiation system 2 according to the comparative example and includes a laser irradiation device 4a in place of the laser irradiation device 4. Hereinafter, a component substantially same as that of the laser irradiation system 2 according to the comparative example is denoted by the same reference sign, and description thereof is omitted as appropriate.

The laser apparatus 3a includes an optical pulse stretcher (OPS) 10 disposed on the optical path of the pulse laser beam between the master oscillator MO and the monitor module 11. The OPS 10 includes a beam splitter 10y and concave mirrors 10a to 10d. The OPS 10 is disposed so that the beam splitter 10y is positioned on the optical path of the pulse laser beam output from the master oscillator MO. The concave mirrors 10a to 10d form a delay optical system.

The concave mirrors 10a to 10d have focal lengths F substantially equal to one another. Each focal length F is equivalent to, for example, the distance from the beam splitter 10y to the concave mirror 10a. The concave mirrors 10a to 10d are disposed to guide light partially reflected by the beam splitter 10y to the beam splitter 10y and normally transfer the light onto the beam splitter 10y. The OPS 10 performs pulse stretching on the pulse laser beam input from the master oscillator MO and outputs the pulse laser beam having an extended pulse time width.

In the present embodiment, the pulse laser beam having a pulse time width extended by the OPS 10 is incident on the monitor module 11.

The laser apparatus 3a preferably outputs the pulse laser beam having a photon energy larger than the bandgap energy of the semiconductor material.

Figure 12:
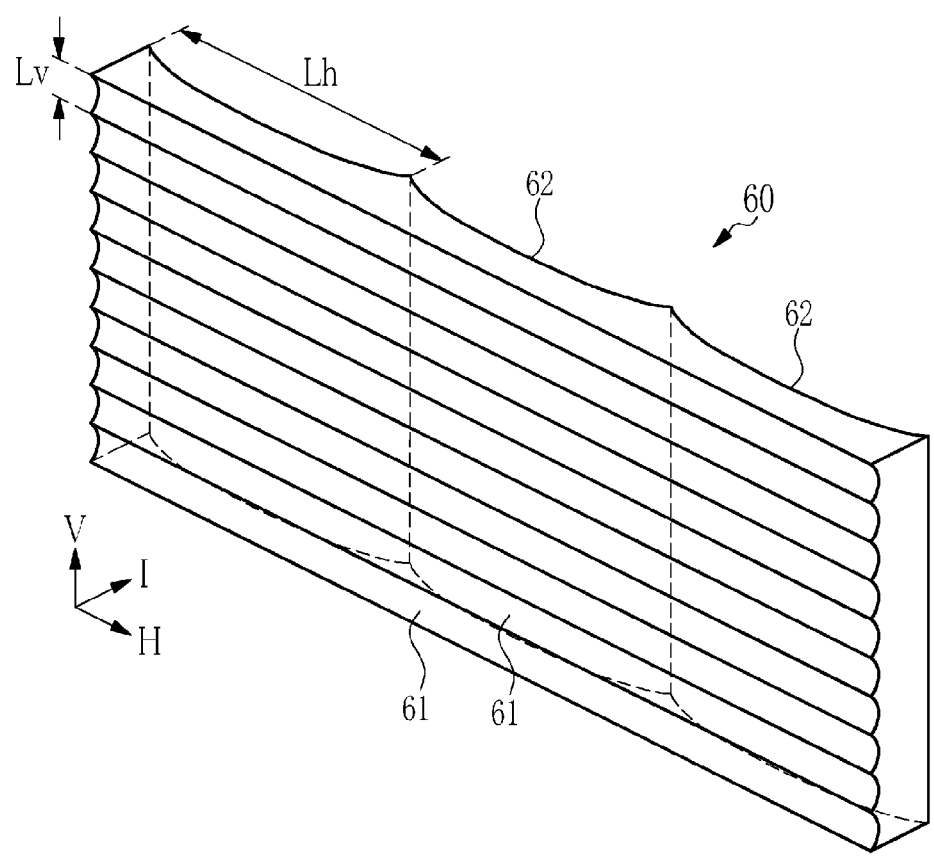
FIG. 12 is a perspective view illustrating the configuration of a fly-eye lens.

In an optical system 40a, the laser irradiation device 4a includes a beam homogenizer 43a in place of the beam homogenizer 43 of the comparative example. The beam homogenizer 43a includes a fly-eye lens 60 illustrated in FIG. 12 in place of the fly-eye lens 45 of the comparative example. In the drawing, an I axial direction represents the traveling direction of the pulse laser beam. A V axial direction and an H axial direction are orthogonal to each other and orthogonal to the traveling direction of the pulse laser beam.

The fly-eye lens 60 is formed by fabricating a transparent substrate made of synthetic quartz or calcium fluoride ($CaF_2$) crystal. A plurality of first cylindrical surfaces 61 each having a concave shape of a first curvature radius in the V axial direction and stretched in the H axial direction are arrayed at a first pitch Lv in the V axial direction on a first surface of the fly-eye lens 60 on which the pulse laser beam is incident. A plurality of second cylindrical surfaces 62 each having a concave shape of a second curvature radius in the H axial direction and stretched in the V axial direction are arrayed at a second pitch Lh in the H axial direction on a second surface of the fly-eye lens 60 opposite to the first surface. The first pitch Lv is shorter than the second pitch Lh.

The first curvature radius of each first cylindrical surface 61 and the second curvature radius of each second cylindrical surface 62 are set so that the focal point position of a concave lens formed of the first cylindrical surface 61 and the focal point position of a concave lens formed of the second cylindrical surface 62 substantially coincide with each other.

In the present embodiment, the memory unit of the laser irradiation control unit 31 stores, as the irradiation condition of the laser-doping beam, the fluence Fd and an irradiation pulse number Nd of the laser-doping beam as the pulse laser beam with which the irradiation object 50 is irradiated at laser doping. The irradiation condition stored in the memory unit may be rewritten by an external device (not illustrated) as appropriate.

The laser irradiation control unit 31 controls the XYZ stage 33 at laser doping to perform scanning irradiation in which the pulse laser beam is emitted while the irradiation object 50 is moved in the XY plane. The laser irradiation control unit 31 calculates, based on the irradiation condition of the laser-doping beam, the transmittance Td of the attenuator 42 and a scanning speed Vdx to be set at laser doping. Details of the above will be described below.

3.2 Scanning Irradiation Control

Figure 13A:
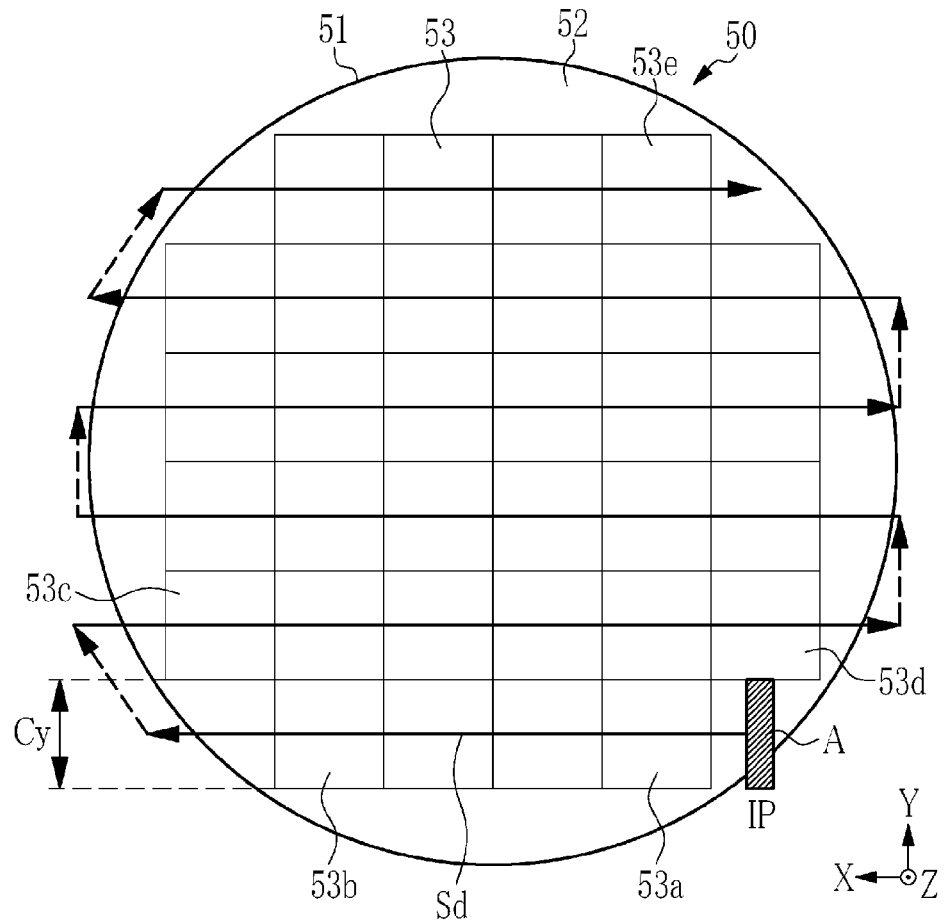
FIG. 13A is a plan view of an irradiation object formed in a wafer shape.

The following describes scanning irradiation control performed by the laser irradiation control unit 31 in the present embodiment. FIG. 13A illustrates the irradiation object 50 obtained by forming the semiconductor substrate 51 in a wafer shape. The semiconductor substrate 51 includes chip formation regions 53 two-dimensionally arrayed in the X and Y axial directions. Each chip formation region 53 has a rectangular shape.

Figure 13B:
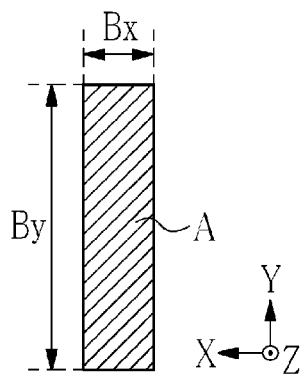
FIG. 13B is a diagram illustrating the shape of the irradiation region.

In FIG. 13A, reference sign A indicates the beam shape, in other words, irradiation region of the pulse laser beam incident on the irradiation object 50 from the beam homogenizer 43a through the high reflectance mirror 41c and the transfer optical system 44. As illustrated in FIG. 13B, the irradiation region A has a rectangular shape with the first beam width Bx in the X axial direction as a scanning direction and the second beam width By in the Y axial direction. The second beam width By is larger than the first beam width Bx. In other words, the beam shape of the pulse laser beam is substantially a line shape. The second beam width By is preferably 5 to 1000 times larger than the first beam width Bx.

The second beam width By is substantially equal to a width Cy of each chip formation region 53 in the Y axial direction. The width Cy indicates a minimum width in the Y axial direction, in other words, a dicing pitch in the Y axial direction when the chip formation regions 53 of the semiconductor substrate 51 are cut into chips. The second beam width By does not need to be equal to the width Cy but may have a value that satisfies Expression (4) below.

$$By = n \cdot Cy \quad (4)$$

In the above expression, n represents an integer equal to or larger than one.

The laser irradiation control unit 31 controls the XYZ stage 33 to perform scanning irradiation in which the irradiation region A is irradiated with the pulse laser beam while the irradiation object 50 is linearly moved at a constant speed in the X axial direction relative to the irradiation region A of the pulse laser beam. The moving speed of the irradiation object 50 at laser doping is the scanning speed Vdx. Reference sign Sd indicates a scanning path at laser doping.

The scanning speed Vdx is calculated by the laser irradiation control unit 31 so that the number of pulses of the pulse laser beam incident at each position in each chip formation region 53 is equal to the irradiation pulse number Nd. Specifically, the laser irradiation control unit 31 calculates the scanning speed Vdx based on Expression (5) below by using data of the irradiation pulse number Nd, the repetition frequency f, and the first beam width Bx.

$$Vdx = f \cdot Bx / Nd \quad (5)$$

When starting laser doping, the laser irradiation control unit 31 sets the irradiation region A to an initial position IP near a first chip formation region 53a positioned at an end part on the first row and starts scanning irradiation along the scanning path Sd at the scanning speed Vdx in the positive X axial direction. The laser irradiation control unit 31 moves the irradiation region A in the positive Y axial direction when the irradiation region A has passed through a second chip formation region 53b positioned at a terminal end on the first row. Subsequently, the laser irradiation control unit 31 executes scanning irradiation in the negative X axial direction from a third chip formation region 53c positioned at an end part on the second row. Then, the laser irradiation control unit 31 moves the irradiation region A by one row in the positive Y axial direction when the irradiation region A has passed through a fourth chip formation region 53d positioned at a terminal end on the second row.

The laser irradiation control unit 31 repeatedly executes the above-described scanning irradiation, and moves the irradiation region A out of the irradiation object 50 and ends the scanning irradiation control when the irradiation region A has passed through a fifth chip formation region 53e positioned at a terminal end on the last row.

3.3 Set Value of Pulse Laser Beam Fluence

The following describes the fluence of the pulse laser beam at laser doping. The fluence is energy density (J/cm²) per pulse of the pulse laser beam on the surface of the irradiation object 50. The laser irradiation control unit 31 sets the laser-doping fluence Fd by controlling the transmittance of the attenuator 42.

The fluence Fd is set in a range that satisfies Expression (6) below.

$$Fath \leq Fd < Fdth \quad (6)$$

In the above expression, Fath represents a fluence threshold at or beyond which ablation potentially occurs to the impurity source film 52 formed on the surface of the semiconductor substrate 51 when the irradiation object 50 is irradiated with the pulse laser beam in the same number of pulses as the irradiation pulse number Nd. In addition, Fdth represents a fluence threshold at or beyond which damage potentially occurs to the surface of the semiconductor substrate 51 when the irradiation object 50 is irradiated with the pulse laser beam in the same number of pulses as the irradiation pulse number Nd. For example, Fdth represents fluence at which the semiconductor substrate 51 has a sublimation temperature.

When the fluence Fd is set in the range of Expression (6) above, the impurity source film 52 can be ablated to dope the semiconductor substrate 51 with impurities while the surface of the semiconductor substrate 51 is not damaged.

The irradiation pulse number Nd is equal to or larger than two. The irradiation pulse number Nd is preferably 5 to 40 inclusive to reduce irradiation unevenness of the pulse laser beam.

3.4 Operation of Laser Irradiation System 3.4.1 Main Flow

FIG. 14 is a flowchart illustrating processing of laser doping control performed by the laser irradiation control unit 31. The laser irradiation control unit 31 operates the laser irradiation system 2a through processing described below.

When the irradiation object 50 is set on the table 32 (step S200), the laser irradiation control unit 31 reads a laser-doping irradiation condition from the memory unit (step S210). The irradiation condition includes the laser-doping fluence Fd and the irradiation pulse number Nd.

Subsequently, the laser irradiation control unit 31 causes the laser apparatus 3 to perform adjustment oscillation (step S220). When the adjustment oscillation is completed, the laser irradiation control unit 31 controls the XYZ stage 33 to set the irradiation region A of the pulse laser beam to the initial position IP illustrated in FIG. 13A (step S230). In addition, the laser irradiation control unit 31 adjusts the XYZ stage 33 in the Z axial direction so that the surface of the irradiation object 50 coincides with the transfer position of a beam image shaped into a rectangular shape on the focal point plane of the condenser lens 46 of the beam homogenizer 43a (step S240).

Subsequently, the laser irradiation control unit 31 calculates a laser-doping parameter (step S250). The parameter includes the transmittance Td of the attenuator 42 and the scanning speed Vdx. Subsequently, the laser irradiation control unit 31 sets the laser-doping parameter to the laser irradiation device 4a (step S260).

Then, the laser irradiation control unit 31 performs scanning irradiation in which the irradiation object 50 is irradiated with the pulse laser beam while the irradiation region A is moved along the scanning path Sd at a constant speed in the X axial direction (step S270). The laser irradiation control unit 31 determines whether the irradiation has ended for all chip formation regions 53 each time scanning irradiation ends for one row in the X axial direction (step S280).

When the irradiation has not ended for all chip formation regions 53 (NO at step S280), the laser irradiation control unit 31 moves the irradiation region A in the Y axial direction and sets the irradiation region A to a scanning irradiation start position on the next row (step S290). Thereafter, the laser irradiation control unit 31 returns the processing to step S270 and executes scanning irradiation in the X axial direction. The laser irradiation control unit 31 repeats steps S270 to S290 until the irradiation ends for all chip formation regions 53. When the irradiation has ended for all chip formation regions 53 (YES at step S280), the laser irradiation control unit 31 ends the laser doping control.

3.4.2 Details of S210

Figure 15:
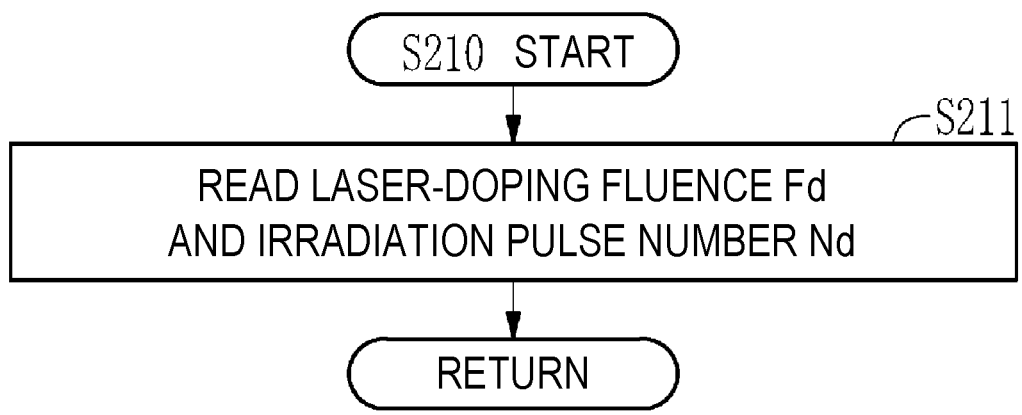
FIG. 15 illustrates a detailed subroutine of processing of reading an irradiation condition.

FIG. 15 illustrates a detailed subroutine of the processing (step S210) of reading the irradiation condition in the main flow illustrated in FIG. 14. In the present embodiment, at step S210, the laser irradiation control unit 31 reads, as the irradiation condition, the laser-doping fluence Fd and the irradiation pulse number Nd from the memory unit (step S211). Thereafter, the laser irradiation control unit 31 returns the processing to the main flow.

3.4.3 Details of S250

Figure 16:
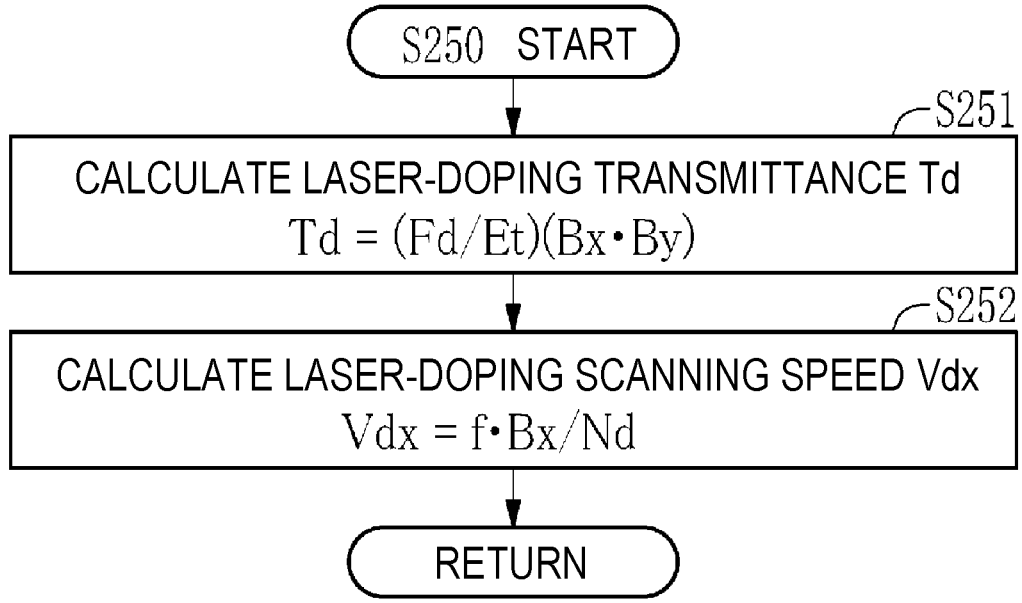
FIG. 16 illustrates a detailed subroutine of processing of calculating a laser-doping parameter.

FIG. 16 illustrates a detailed subroutine of the processing (step S250) of calculating the laser-doping parameter in the main flow illustrated in FIG. 14. In the present embodiment, at step S250, the laser irradiation control unit 31 calculates the laser-doping transmittance Td of the attenuator 42 based on Expression (2) above by using data of the fluence Fd read at step S211 (step S251). Then, the laser irradiation control unit 31 calculates a laser-doping first scanning speed Vdx based on Expression (5) above by using data of the irradiation pulse number Nd, the repetition frequency f, and the first beam width Bx, (step S252). Thereafter, the laser irradiation control unit 31 returns the processing to the main flow.

3.4.4 Details of S260

Figure 17:
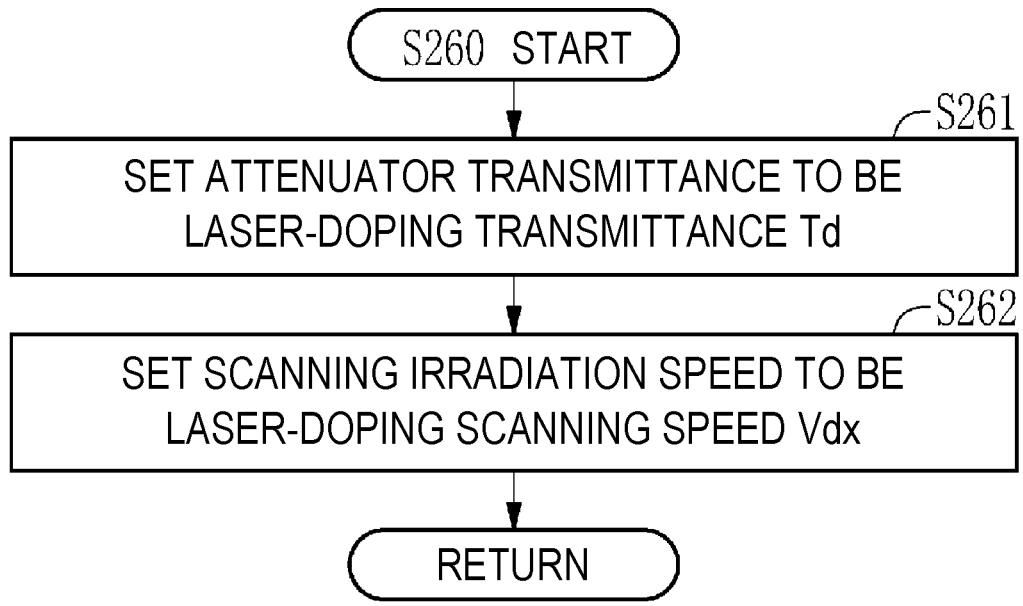
FIG. 17 illustrates a detailed subroutine of processing of setting the laser-doping parameter.

FIG. 17 illustrates a detailed subroutine of the processing (step S260) of setting the laser-doping parameter in the main flow illustrated in FIG. 14. In the present embodiment, at step S260, the laser irradiation control unit 31 sets the transmittance of the attenuator 42 to be the transmittance Td calculated at step S251 (step S261). Specifically, the laser irradiation control unit 31 sets the rotation stages 42c and 42d included in the attenuator 42 so that the transmittance of the attenuator 42 is equal to the transmittance Td.

Subsequently, the laser irradiation control unit 31 sets the speed of scanning irradiation to be the scanning speed Vdx calculated at step S252 (step S262). Specifically, the laser irradiation control unit 31 sets the XYZ stage 33 so that the moving speed of the irradiation region A relative to the irradiation object 50 is equal to the scanning speed Vdx. Thereafter, the laser irradiation control unit 31 returns the processing to the main flow.

3.4.5 Details of S270

Figure 18:
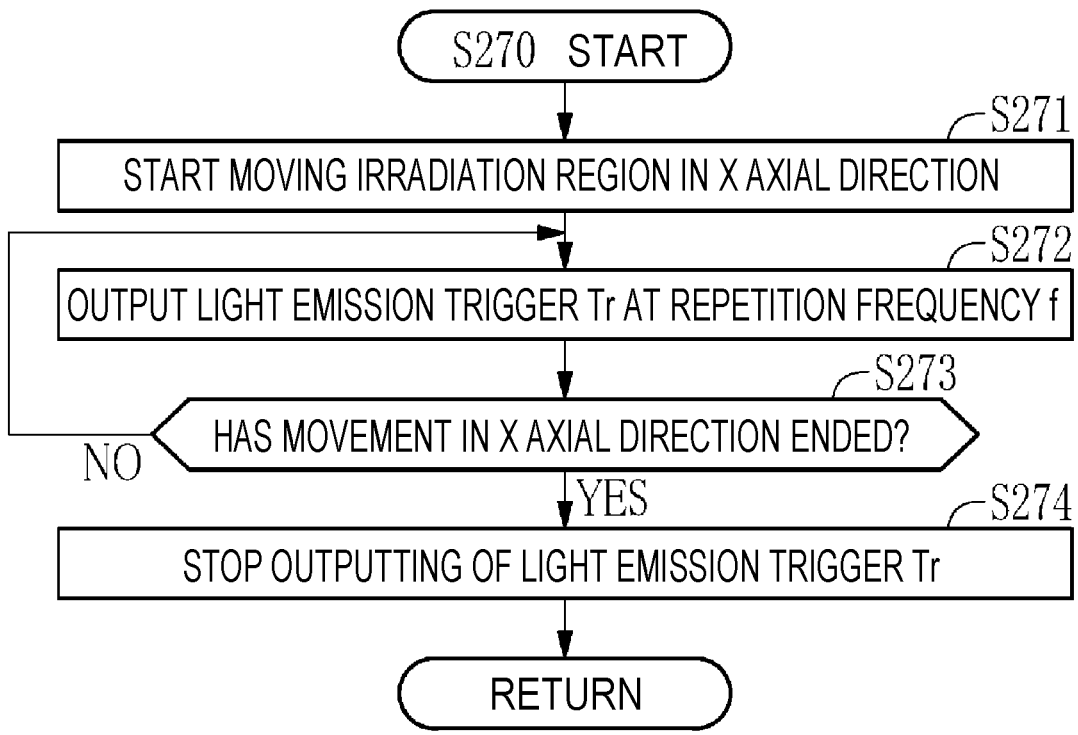
FIG. 18 illustrates a detailed subroutine of processing of scanning irradiation in an X axial direction.

FIG. 18 illustrates a detailed subroutine of the processing (step S270) of performing scanning irradiation in the X axial direction in the main flow illustrated in FIG. 14. At step S270, first, the laser irradiation control unit 31 controls the XYZ stage 33 to start movement of the irradiation region A in the X axial direction (step S271). The movement of the irradiation region A includes acceleration motion, constant speed linear motion, and deceleration motion, and the XYZ stage 33 is set so that the speed of constant speed linear motion is equal to the scanning speed Vdx.

After the movement of the irradiation region A is started, the laser irradiation control unit 31 outputs the light emission trigger Tr to the laser control unit 13 at the repetition frequency f (step S272). The repetition frequency f is, for example, 6000 Hz. Then, until the movement of the irradiation region A in the X axial direction ends (while NO at step S273), the laser irradiation control unit 31 executes step S272 to output the light emission trigger Tr to the laser control unit 13. When the movement of the irradiation region A in the X axial direction has ended (YES at step S273), the laser irradiation control unit 31 stops outputting of the light emission trigger Tr to the laser control unit 13 (step S274). Thereafter, the laser irradiation control unit 31 returns the processing to the main flow.

At step S270, the pulse laser beam irradiation is performed from the start of the movement of the irradiation region A to the end of the movement, but no pulse laser beam irradiation may be performed during acceleration motion or deceleration motion other than constant speed linear motion.

Details of step S220 in the main flow are same as details of step S120 described in the comparative example, and thus description thereof is omitted.

3.5 Effect

According to the present embodiment, since the irradiation object is irradiated with the pulse laser beam having the fluence Fd that satisfies Expression (6) above, a plurality of pulses of the pulse laser beam can be made incident at the same position on the impurity source film 52.

For example, in the present embodiment, when part of the pulse laser beam with which the impurity source film 52 is irradiated has low fluence and part of the impurity source film 52 remains as residue on the surface of the semiconductor substrate 51, the residue can be ablated and removed through irradiation with the subsequent pulse laser beam. Since the subsequent pulse laser beam has fluence in the range of Expression (6) above, damage on the surface of the semiconductor substrate 51 is prevented. When part of the pulse laser beam with which the impurity source film 52 is irradiated has high fluence, damage on the surface of the semiconductor substrate 51 is prevented since the fluence is in the range of Expression (6) above.

In addition, according to the present embodiment, since scanning irradiation is performed so that a plurality of pulses of the pulse laser beam are made incident at each position on the surface of the irradiation object 50 while the irradiation region A is moved relative to the irradiation object 50, homogeneity of the amount of irradiation over the positions on the surface of the irradiation object 50 improves.

In addition, according to the present embodiment, the pulse laser beam has a beam shape that satisfies By<Bx, and scanning irradiation is performed with the irradiation region A having area smaller than that of each chip formation region 53. Accordingly, in the present embodiment, even the laser apparatus 3a configured to emit the pulse laser beam having a small pulse energy can provide fluence suitable for laser doping.

3.6 Specific Example of Semiconductor Substrate Made of SiC

The following describes specific examples of various parameters when the crystal structure of the semiconductor substrate 51 of the irradiation object 50 is 4H—SiC. In this case, a KrF excimer laser apparatus configured to output the pulse laser beam having a central wavelength of 248.4 nm approximately is preferably used as the laser apparatus 3a. In this case, the pulse laser beam preferably has a pulse width TIS of 20 ns to 500 ns inclusive. The pulse width TIS is defined by Expression (7) below. In the expression below, t represents time, and I(t) represents light intensity at time t.

[Expression 1]

$$TIS = \frac{\left[\int I(t)dt\right]^2}{\int I(t)^2 dt} \quad (7)$$

When the pulse width TIS is smaller than 20 ns, a doping region formed in the semiconductor substrate 51 by laser doping has a short diffusion length and thus has reduced functionality of a doping layer. When the pulse width TIS is larger than 500 ns and the impurity source film 52 is an aluminum metal film, flocculation occurs to the impurity source film 52 and decreases homogeneity of the doping region.

When the pulse width TIS is 20 ns to 500 ns inclusive, a fluence threshold Fdth at or beyond which damage potentially occurs to the surface of the semiconductor substrate 51 at laser doping is 3.5 J/cm$^2$ to 10 J/cm$^2$ inclusive.

The fluence threshold Fdth at or beyond which ablation potentially occurs to the impurity source film 52 is 1.5 J/cm$^2$ when the impurity source film 52 is an aluminum metal film. In this case, the impurity source film 52 preferably has a thickness of 50 nm to 450 nm inclusive. When the impurity source film 52 has a thickness smaller than 50 nm, damage potentially occurs to the surface of the semiconductor substrate 51 at ablation of the impurity source film 52.

The threshold Fdth is 1.2 J/cm$^2$ when the impurity source film 52 is a SiN film. In this case, the impurity source film 52 preferably has a thickness equal to or larger than 20 nm. When the impurity source film 52 is a SiN film, no flocculation occurs, and thus the upper limit of the thickness is not particularly restricted in terms of doping characteristics. However, too large thickness of the impurity source film 52 decreases throughput, and thus the thickness is preferably equal to or smaller than 300 nm. Accordingly, the thickness is preferably 100 nm approximately when the impurity source film 52 is a SiN film.

4. Second Embodiment

The following describes a second embodiment. The second embodiment relates to a laser irradiation system configured to dope a semiconductor substrate with impurities by irradiating an irradiation object in which an impurity source film is formed on the semiconductor substrate with a pulse laser beam and to perform post-annealing processing for activating the impurities.

4.1 Configuration

The configuration of the laser irradiation system according to the second embodiment is same as that of the laser irradiation system 2a according to the first embodiment. In the present embodiment, the laser irradiation control unit 31 performs post annealing control in addition to laser doping control.

In the present embodiment, the memory unit of the laser irradiation control unit 31 stores a first irradiation condition of a laser-doping beam and a second irradiation condition of a post-annealing beam. The first irradiation condition includes fluence Fd and an irradiation pulse number Nd of the laser-doping beam as a pulse laser beam with which the irradiation object 50 is irradiated at laser doping. The second irradiation condition includes fluence Fp and an irradiation pulse number Np of the post-annealing beam as a pulse laser beam with which the irradiation object 50 is irradiated at post annealing.

The fluence Fd is referred to as first fluence Fd. The irradiation pulse number Nd is referred to as a first irradiation pulse number Nd. The fluence Fp is referred to as second fluence Fp. The irradiation pulse number Np is referred to as a second irradiation pulse number Np. The first and second irradiation conditions stored in the memory unit may be rewritten by an external device (not illustrated) as appropriate.

At laser doping and post annealing, the laser irradiation control unit 31 controls the XYZ stage 33 to perform scanning irradiation in which the pulse laser beam is emitted while the irradiation object 50 is moved in the XY plane. The laser irradiation control unit 31 calculates a first transmittance Td and of the attenuator 42 and a first scanning speed Vdx, which are set at laser doping, based on the first irradiation condition. The laser irradiation control unit 31 also calculates a second transmittance Tp of the attenuator 42 and a second scanning speed Vpx, which are set at post annealing, based on the second irradiation condition. Details of the above will be described below.

4.2 Scanning Irradiation Control

Figure 19A:
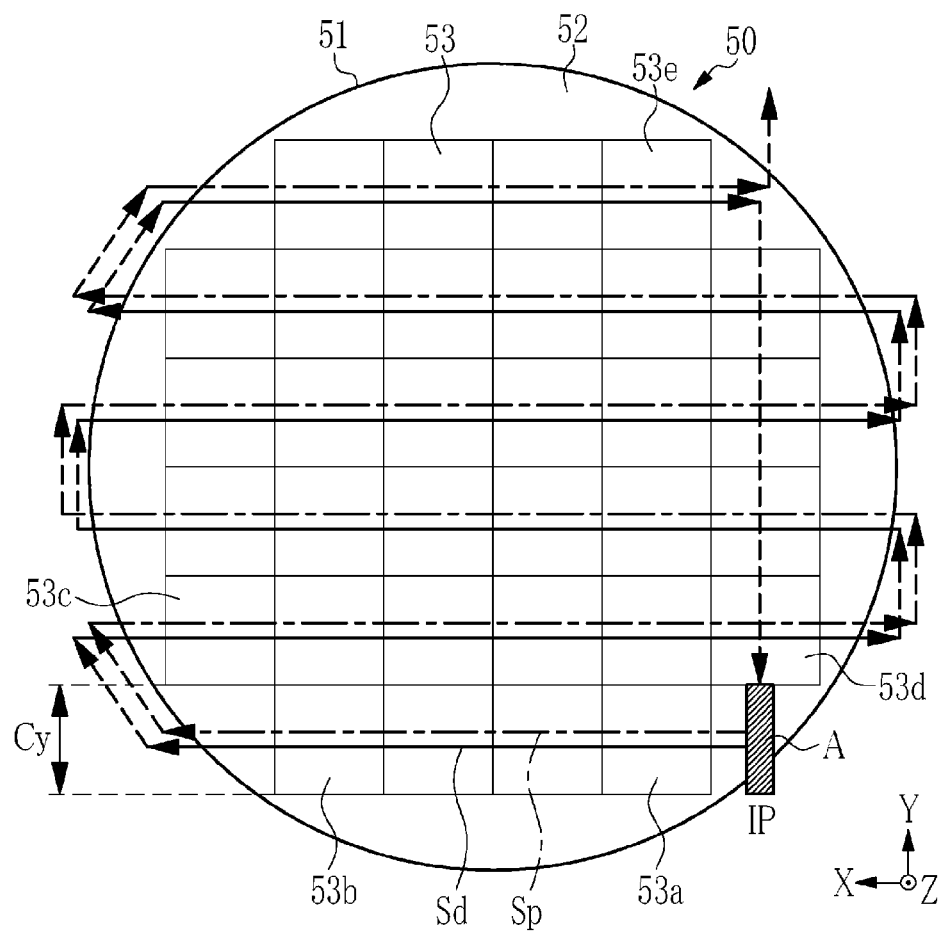
FIG. 19A is a diagram for description of scanning irradiation control in a second embodiment.
Figure 19B:
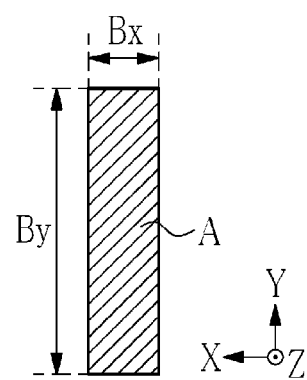
FIG. 19B is a diagram illustrating the shape of the irradiation region.

The following describes scanning irradiation control performed by the laser irradiation control unit 31 in the present embodiment. FIGS. 19A and 19B illustrate the irradiation object 50 and the irradiation region A. The shape of the irradiation region A in the present embodiment is same as that in the first embodiment.

The laser irradiation control unit 31 controls the XYZ stage 33 to perform scanning irradiation while the irradiation object 50 is linearly moved at a constant speed in the X axial direction relative to the irradiation region A of the pulse laser beam. The moving speed of the irradiation object 50 at laser doping is the first scanning speed Vdx, and the moving speed of the irradiation object 50 at post annealing is the second scanning speed Vpx. Reference sign Sd indicates a first scanning path at laser doping. Reference sign Sp indicates a second scanning path at post annealing. In the present comparative example, the first scanning path Sd and the second scanning path Sp are identical to each other.

The first scanning speed Vdx is calculated by the laser irradiation control unit 31 so that the number of pulses of the pulse laser beam incident at each position in each chip formation region 53 is equal to the first irradiation pulse number Nd. Specifically, the laser irradiation control unit 31 calculates the first scanning speed Vdx based on Expression (5).

The second scanning speed Vpx is calculated by the laser irradiation control unit 31 so that the number of pulses of the pulse laser beam incident at each position in each chip formation region 53 is equal to the second irradiation pulse number Np. Specifically, the laser irradiation control unit 31 calculates the second scanning speed Vpx based on Expression (8) below by using data of the second irradiation pulse number Np, the repetition frequency f, and the first beam width Bx.

$$Vpx = f \cdot Bx/Np \quad (8)$$

Similarly to the first embodiment, at laser doping, the laser irradiation control unit 31 moves the irradiation region A at the first scanning speed Vdx along the first scanning path Sd from the initial position IP. When the irradiation region A has passed through the fifth chip formation region 53e positioned at the terminal end on the last row, the laser irradiation control unit 31 returns the irradiation region A to the initial position IP. Thereafter, the laser irradiation control unit 31 executes post-annealing scanning irradiation at the second scanning speed Vpx along the second scanning path Sp.

4.3 Set Value of Pulse Laser Beam Fluence

Figure 20:
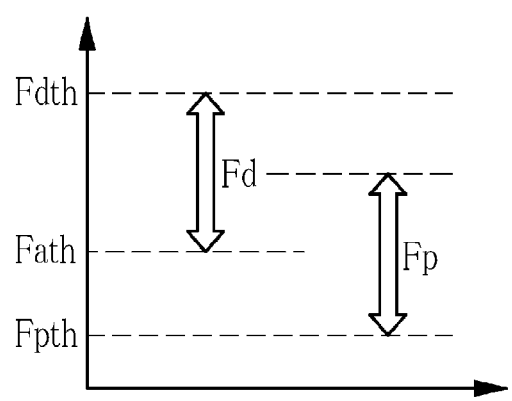
FIG. 20 is a diagram for description of set values of first fluence $Fd$ and second fluence $Fp$.

FIG. 20 is a diagram for description of set values of the first fluence Fd and the second fluence Fp. Similarly to the first embodiment, the first fluence Fd is set in the range that satisfies Expression (6) above.

The second fluence Fp only needs to be set in the range that satisfies Expression (9) below in principle, but is preferably set in the range that satisfies Expression (10) below.

$$Fpth \leq Fp < Fdth \qquad (9)$$

$$Fpth \leq Fp < Fd \qquad (10)$$

In the above expression, Fpth represents a fluence threshold at or beyond which defects generated in the semiconductor substrate 51 by doping are potentially repaired when the semiconductor substrate 51 after doping is irradiated with the pulse laser beam in the same number of pulses as the second irradiation pulse number Np. When the second fluence Fp is set in the range of Expression (9) or (10) above, post-annealing processing can be performed to activate impurities while the surface of the semiconductor substrate 51 is not damaged.

The first irradiation pulse number Nd and the second irradiation pulse number Np preferably satisfy the relation of Expression (11) below.

$$2 \leq Nd < Np \qquad (11)$$

4.4 Set Value of Attenuator Transmittance

The following describes a set value of the transmittance of the attenuator 42 for setting the fluence of the pulse laser beam to be a predetermined value. In the present embodiment, the laser irradiation control unit 31 calculates the first transmittance Td and the second transmittance Tp by substituting the first fluence Fd and the second fluence Fp into Expression (2) above, respectively. When the transmittance T' has a constant value smaller than one, the first transmittance Td and the second transmittance Tp may be calculated based on Expression (3) above.

4.5 Operation of Laser Irradiation System 4.5.1 Main Flow

Figure 21:
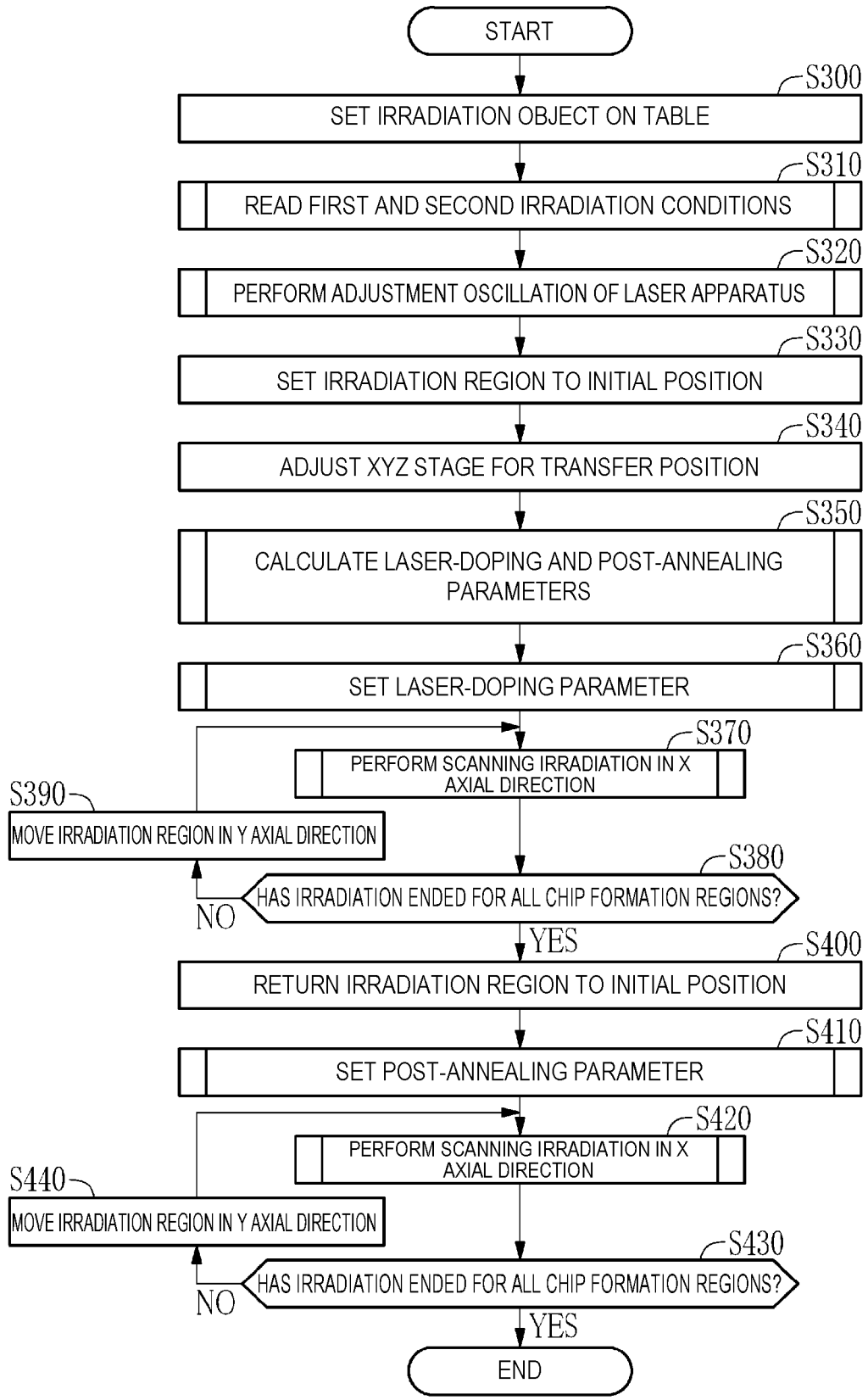
FIG. 21 is a flowchart illustrating processing of laser doping control and post annealing control performed by the laser irradiation control unit.

FIG. 21 is a flowchart illustrating processing of laser doping control and post annealing control performed by the laser irradiation control unit 31. The laser irradiation control unit 31 operates the laser irradiation system 2a through processing described below.

When the irradiation object 50 is set on the table 32 (step S300), the laser irradiation control unit 31 reads a first irradiation condition for laser doping and a second irradiation condition for post annealing from the memory unit (step S310). The first irradiation condition includes the first fluence Fd and the first irradiation pulse number Nd. The second irradiation condition includes the second fluence Fp and the second irradiation pulse number Np.

Subsequently, the laser irradiation control unit 31 causes the laser apparatus 3a to perform adjustment oscillation (step S320). When the adjustment oscillation is completed, the laser irradiation control unit 31 controls the XYZ stage 33 to set the irradiation region A of the pulse laser beam to the initial position IP illustrated in FIG. 19A (step S330). In addition, the laser irradiation control unit 31 adjusts the XYZ stage 33 in the Z axial direction so that the surface of the irradiation object 50 coincides with the transfer position (step S340).

Subsequently, the laser irradiation control unit 31 calculates laser-doping and post-annealing parameters (step S350). The laser-doping parameter includes the first transmittance Td of the attenuator 42 and the first scanning speed Vdx. The post-annealing parameter includes the second transmittance Tp of the attenuator 42 and the second scanning speed Vpx.

The laser irradiation control unit 31 sets the laser-doping parameter to the laser irradiation device 4a (step S360). Then, the laser irradiation control unit 31 performs scanning irradiation in which the irradiation object 50 is irradiated with the pulse laser beam while the irradiation region A is moved at a constant speed in the X axial direction along the first scanning path Sd (step S370). The subsequent steps S380 and S390 are same as steps S280 and S290 of the first embodiment. When the irradiation has ended for all chip formation regions 53 (YES at step S380), the laser irradiation control unit 31 ends the laser doping control and returns the irradiation region A to the initial position IP (step 400).

Subsequently, the laser irradiation control unit 31 sets the post-annealing parameter to the laser irradiation device 4 (step S410). Then, the laser irradiation control unit 31 performs scanning irradiation in which the irradiation object 50 is irradiated with the pulse laser beam while the irradiation region A is moved at a constant speed in the X axial direction along the second scanning path Sp (step S420). The subsequent steps S430 and S440 are same as steps S380 and S390. When the irradiation has ended for all chip formation regions 53 (YES at step S430), the laser irradiation control unit 31 ends the post annealing control.

4.5.2 Details of S310

Figure 22:
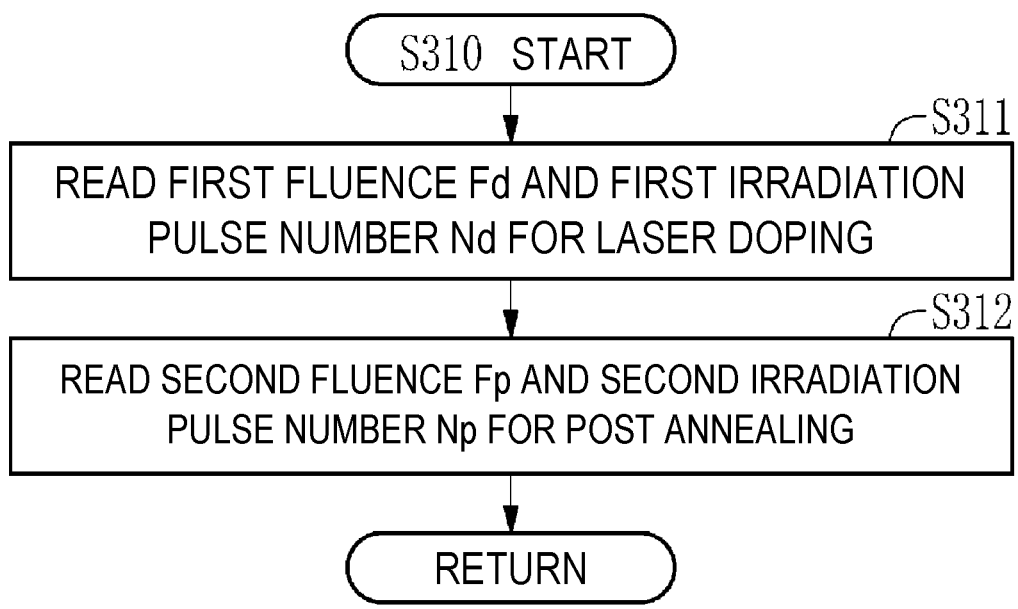
FIG. 22 illustrates a detailed subroutine of processing of reading first and second irradiation conditions.

FIG. 22 illustrates a detailed subroutine of the processing (step S310) of reading the first and second irradiation conditions in the main flow illustrated in FIG. 21. At step S310, first, the laser irradiation control unit 31 reads, as the first irradiation condition, the first fluence Fd and the first irradiation pulse number Nd from the memory unit (step S311). Then, the laser irradiation control unit 31 reads, as the second irradiation condition, the second fluence Fp and the second irradiation pulse number Np from the memory unit (step S312). Thereafter, the laser irradiation control unit 31 returns the processing to the main flow.

4.5.3 Details of S350

Figure 23:
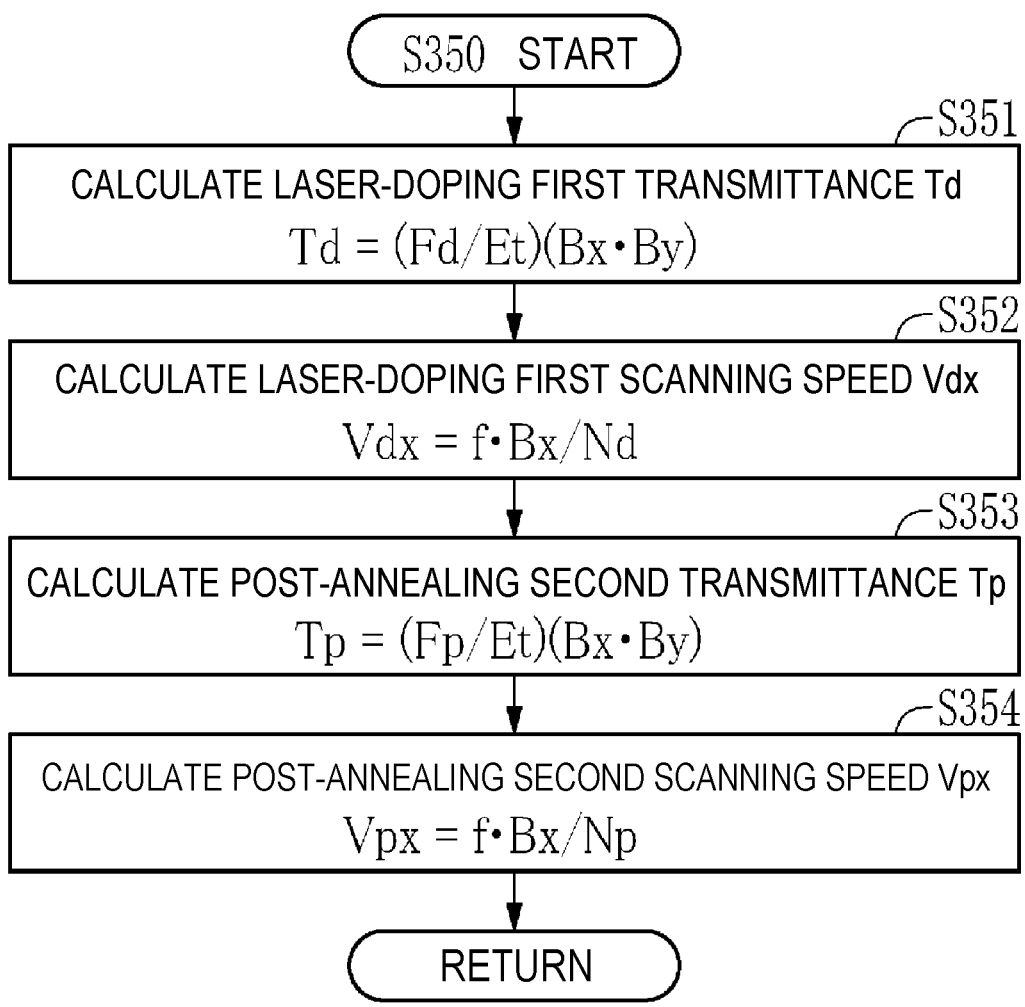
FIG. 23 illustrates a detailed subroutine of processing of calculating laser-doping and post-annealing parameters.

FIG. 23 illustrates a detailed subroutine of the processing (step S350) of calculating the laser-doping and post-annealing parameters in the main flow illustrated in FIG. 21. At step S350, first, the laser irradiation control unit 31 calculates the laser-doping first transmittance Td based on Expression (2) above by using data of the first fluence Fd (step S351). Then, the laser irradiation control unit 31 calculates the laser-doping first scanning speed Vdx based on Expression (5) above by using data of the first irradiation pulse number Nd, the repetition frequency f, and the first beam width Bx (step S352).

Subsequently, the laser irradiation control unit 31 calculates the post-annealing second transmittance Tp based on Expression (2) above by using data of the second fluence Fp (step S353). Then, the laser irradiation control unit 31 calculates the post-annealing second scanning speed Vpx based on Expression (8) above by using data of the second irradiation pulse number Np, the repetition frequency f, and the first beam width Bx, (step S354). Thereafter, the laser irradiation control unit 31 returns the processing to the main flow.

4.5.4 Details of S360

Figure 24:
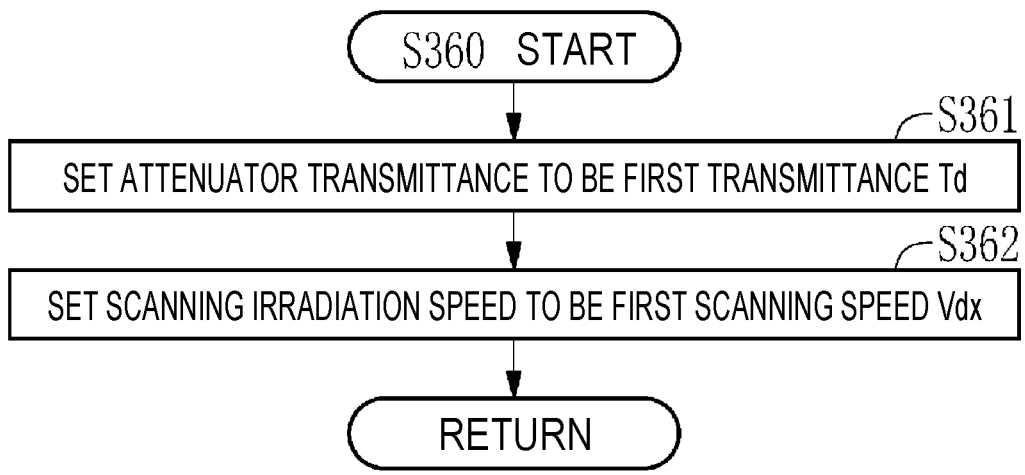
FIG. 24 illustrates a detailed subroutine of processing of setting the laser-doping parameter.

FIG. 24 illustrates a detailed subroutine of the processing (step S360) of setting the laser-doping parameter in the main flow illustrated in FIG. 21. At step S360, first, the laser irradiation control unit 31 sets the transmittance of the attenuator 42 to be the first transmittance Td calculated at step S351 (step S361). Specifically, the laser irradiation control unit 31 sets the rotation stages 42c and 42d included in the attenuator 42 so that the transmittance of the attenuator 42 is equal to the first transmittance Td.

Subsequently, the laser irradiation control unit 31 sets the speed of scanning irradiation to be the first scanning speed Vdx calculated at step S352 (step S362). Specifically, the laser irradiation control unit 31 sets the XYZ stage 33 so that the moving speed of the irradiation region A relative to the irradiation object 50 is equal to the first scanning speed Vdx. Thereafter, the laser irradiation control unit 31 returns the processing to the main flow.

4.5.5 Details of S410

Figure 25:
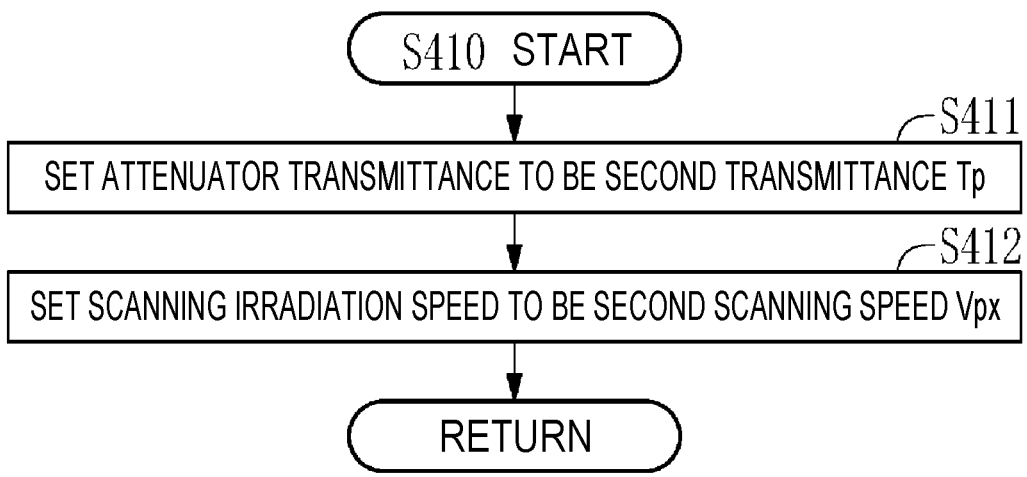
FIG. 25 illustrates a detailed subroutine of processing of setting the post-annealing parameter.

FIG. 25 illustrates a detailed subroutine of the processing (step S410) of setting the post-annealing parameter in the main flow illustrated in FIG. 21. At step S410, first, the laser irradiation control unit 31 sets the transmittance of the attenuator 42 to be the second transmittance Tp calculated at step S353 (step S411). Specifically, the laser irradiation control unit 31 sets the rotation stages 42c and 42d included in the attenuator 42 so that the transmittance of the attenuator 42 is equal to the second transmittance Tp.

Subsequently, the laser irradiation control unit 31 sets the speed of scanning irradiation to be the second scanning speed Vpx calculated at step S354 (step S412). Specifically, the laser irradiation control unit 31 controls the XYZ stage 33 so that the moving speed of the irradiation region A relative to the irradiation object 50 is equal to the second scanning speed Vpx. Thereafter, the laser irradiation control unit 31 returns the processing to the main flow.

Details of each of steps S370 and S420 in the main flow are same as details of step S270, and thus description thereof is omitted.

4.6 Effect

According to the present embodiment, the fluence of the pulse laser beam and the number of irradiation pulses can be set to values suitable for laser doping and post annealing by controlling the transmittance of the attenuator 42 and the speed of scanning irradiation. Thus, according to the present embodiment, laser doping and post annealing can be performed by one laser irradiation system.

4.7 Specific Example of Parameters

Table 1 below lists specific examples of parameters at laser doping and post annealing in a case of Et=100 mJ in the second embodiment. Table 2 below lists specific examples of parameters at laser doping and post annealing in a case of Et=40 mJ in the second embodiment.

TABLE 1

| Laser doping | | Post annealing | |
|---|---|---|---|
| Et | 100 mJ | Et | 100 mJ |
| f | 6000 Hz | f | 6000 Hz |
| By | 10 mm | By | 10 mm |
| Nd | 10 pulses | Np | 100 pulses |
| Fd | 6 J/cm$^2$ | Fp | 4 J/cm$^2$ |
| Td | 1 | Tp | 0.67 |
| Bx | 0.17 mm | Bx | 0.17 mm |
| By/Bx | 60 | By/Bx | 60 |
| Vdx | 100 mm/s | Vdx | 10 mm/s |

TABLE 2

| Laser doping | | Post annealing | |
|---|---|---|---|
| Et | 40 mJ | Et | 40 mJ |
| f | 4000 Hz | f | 4000 Hz |
| By | 10 mm | By | 10 mm |
| Nd | 10 pulses | Np | 100 pulses |
| Fd | 6 J/cm$^2$ | Fp | 4 J/cm$^2$ |
| Td | 1 | Tp | 0.67 |
| Bx | 0.07 mm | Bx | 0.07 mm |
| By/Bx | 150 | By/Bx | 150 |
| Vdx | 26.7 mm/s | Vdx | 2.67 mm/s |

Tables 1 and 2 indicate that, in the present embodiment, laser doping and post annealing are possible even when the pulse energy of the pulse laser beam is low at 100 mJ or 40 mJ. As described above, the fluence Fd at laser doping and the fluence Fp at post annealing can be set by adjusting the transmittance of the attenuator 42. The values of the transmittances Td and Tp of the attenuator 42 in Tables 1 and 2 are sufficiently adjustable.

The irradiation pulse number Nd at laser doping and the irradiation pulse number Np at post annealing can be set by adjusting the scanning speeds Vdx and Vpx, respectively. The values of the scanning speeds Vdx and Vpx in Tables 1 and 2 are sufficiently adjustable.

The aspect ratio By/Bx of the irradiation region A is 60 in a case of Table 1 and is 100 in a case of Table 2. The beam shape of the pulse laser beam is substantially a line shape.

In the second embodiment, fluence is set by changing the transmittance of the attenuator 42, but the fluence setting method is not limited thereto. For example, when the pulse energy of the pulse laser beam output from the laser apparatus 3a is highly stable, fluence may be set by changing the target pulse energy Et.

4.8 Aspect Ratio of Irradiation Region

The following describes an appropriate range of the aspect ratio By/Bx of the irradiation region A on the surface of the irradiation object 50. When the irradiation region A is irradiated with the pulse laser beam, thermal energy is locally provided only to the irradiation region A of the irradiation object 50, and temperature difference occurs between the irradiation region A and its surrounding region. Thus, only the irradiation region A thermally expands on the surface of the irradiation object 50, and the circumference of the irradiation region A is potentially damaged. In particular, the vicinity of an apex of the irradiation region A is highly likely to be damaged due to the difference between thermal expansion in the X axial direction and thermal expansion in the Y axial direction.

To prevent such damage, it is preferable that the aspect ratio By/Bx of the irradiation region A is high and the direction of thermal expansion of the irradiation region A is substantially one-dimensional. For example, the aspect ratio By/Bx is preferably in the range of Expression (12) below.

$$10 \leq By/Bx \leq 1000 \tag{12}$$

In the above expression, the value of 1000, which is the aspect ratio By/Bx at the upper limit corresponds to a case in which the pulse energy of the pulse laser beam necessary in a case of By=24 mm, Bx=0.024 mm, and Fd=6 J/cm$^2$ is 34 mJ. This indicates that doping is possible by performing scanning irradiation with the pulse laser beam having a pulse energy of 34 mJ.

The first beam width Bx is preferably in the range of Expression (13) below.

$$3 \text{ mm} \leq By \leq 24 \text{ mm} \tag{13}$$

In the above expression, the value of 3 mm, which is the first beam width Bx at the lower limit is the minimum value of the width Cy of each chip formation region 53 in the Y axial direction.

4.9 Kind of Laser Apparatus

The following describes the kind of a laser apparatus suitable for both laser doping and post annealing. Table 3 indicates the relation between the kind of the semiconductor material forming the semiconductor substrate 51 of the irradiation object 50 and the kind of a laser apparatus usable for both laser doping and post annealing. To enable post annealing, a pulse laser beam output from a laser apparatus needs to be absorbed by the semiconductor material. Thus, the laser apparatus suitable for both laser doping and post annealing preferably outputs a pulse laser beam having a photon energy larger than the bandgap energy of the semiconductor material.

TABLE 3

| Semiconductor material | Chemical formula | Bandgap (eV) | Laser apparatus |
|---|---|---|---|
| Aluminum nitride | AlN | 6.3 | $F_2$, ArF |
| Diamond | C | 5.5 | $F_2$, ArF |
| Zinc sulfide | ZnS | 3.6 | $F_2$, ArF, KrF |
| Gallium nitride | GaN | 3.4 | $F_2$, ArF, KrF |
| Zinc oxide | ZnO | 3.37 | $F_2$, ArF, KrF |
| Silicon oxide (for power device) | 4H—SiC | 3.26 | $F_2$, ArF, KrF |

Table 4 indicates the relation among the kind of the laser apparatus, the central wavelength of the pulse laser beam, and the photon energy. When the semiconductor material is 4H—SiC, ZnO, GaN, or ZnS, the central wavelength of the pulse laser beam output from the laser apparatus is preferably equal to or shorter than 270 nm. Thus, in this case, the laser apparatus is preferably a KrF excimer laser apparatus, an ArF excimer laser apparatus, or a $F_2$ excimer laser apparatus. In particular, a KrF excimer laser apparatus having a high oscillation efficiency and a high pulse energy is preferably used.

TABLE 4

| Laser apparatus | Central wavelength (nm) | Photon energy (eV) |
|---|---|---|
| KrF | 248.4 | 5.0 |
| ArF | 193.4 | 6.4 |
| $F_2$ | 157 | 7.9 |

When the semiconductor material is AlN or C, the bandgap energy is large, and thus the laser apparatus is preferably an ArF excimer laser apparatus or a $F_2$ excimer laser apparatus.

5. First Modification

The following describes a first modification. In the second embodiment, as described with reference to FIG. 19, the post-annealing scanning irradiation is performed after the laser-doping scanning irradiation is performed for each irradiation region A on the irradiation object 50. Instead, the laser-doping scanning irradiation and the post-annealing scanning irradiation may be alternately performed. Specifically, the scanning direction is same between laser doping and post annealing in the second embodiment, but is opposite between laser doping and post annealing in the present modification. The following describes a modification related to the scanning irradiation control in the second embodiment.

5.1 Scanning Irradiation Control

Figure 26:
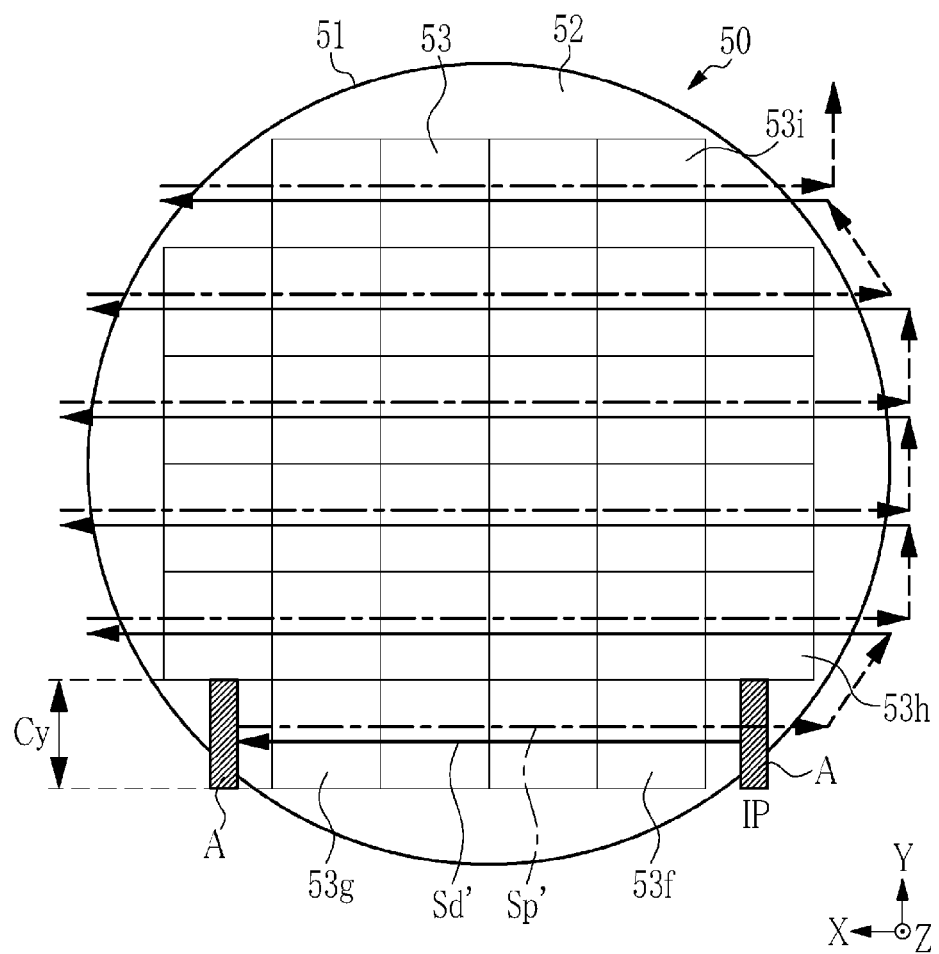
FIG. 26 is a diagram illustrating a scanning path in a first modification.

FIG. 26 illustrates a first scanning path Sd' at laser doping and a second scanning path Sp' at post annealing in the present modification. The first scanning path Sd' extends in the positive X axial direction. The second scanning path Sp' extends in the negative X axial direction. In other words, at laser doping, the irradiation region A moves relative to the irradiation object 50 in the positive X axial direction. At post annealing, the irradiation region A moves relative to the irradiation object 50 in the negative X axial direction. The irradiation region A has the shape illustrated in FIG. 19B.

When starting laser doping, the laser irradiation control unit 31 sets the irradiation region A to the initial position IP near a first chip formation region 53f positioned at an end part on the first row, and starts scanning irradiation along the first scanning path Sd' at the first scanning speed Vdx in the positive X axial direction. When the irradiation region A has passed through a second chip formation region 53g positioned at a terminal end on the first row, the laser irradiation control unit 31 sets the irradiation region A near the second chip formation region 53g. Then, the laser irradiation control unit 31 executes scanning irradiation at the second scanning speed Vpx in the negative X axial direction from the second chip formation region 53g.

Subsequently, when the irradiation region A has passed through the first chip formation region 53f, the laser irradiation control unit 31 moves the irradiation region A by one row in the positive Y axial direction. Then, the laser irradiation control unit 31 sets the irradiation region A near a third chip formation region 53h. The laser irradiation control unit 31 repeatedly executes the above-described scanning irradiation, and returns the irradiation region A to the initial position IP when the irradiation region A has passed through a fourth chip formation region 53i positioned at an end part on the last row. Then, the laser irradiation control unit 31 ends the scanning irradiation control. Thereafter, the irradiation object 50 may be replaced with a new irradiation object 50.

5.2 Operation of Laser Irradiation System

Figure 27:
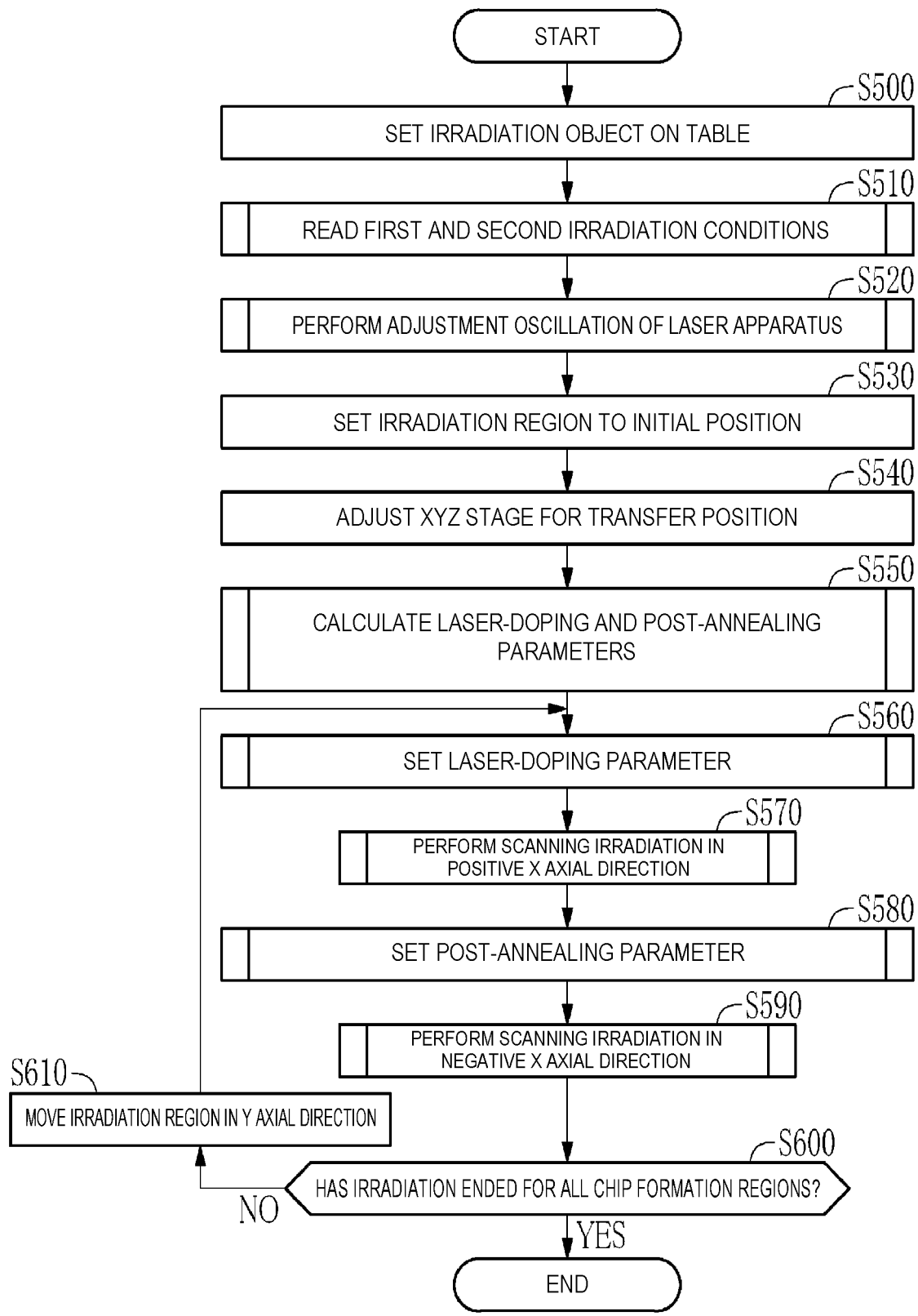
FIG. 27 is a flowchart illustrating processing of laser doping control and post annealing control performed by the laser irradiation control unit.

FIG. 27 is a flowchart illustrating processing of laser doping control and post annealing control performed by the laser irradiation control unit 31. Steps S500 to S550 of the present embodiment are same as steps S300 to S350 of the second embodiment. In the present embodiment, after setting the laser-doping parameter at step S560, the laser irradiation control unit 31 executes scanning irradiation for one row at the first scanning speed Vdx in the positive X axial direction (step S570).

Subsequently, when the scanning irradiation for one row in the positive X axial direction has ended, the laser irradiation control unit 31 sets the post-annealing parameter to the laser irradiation device 4a (step S580). Then, the laser irradiation control unit 31 executes scanning irradiation for one row at the second scanning speed Vpx in the negative X axial direction (step S590). The laser irradiation control unit 31 determines whether the irradiation has ended for all chip formation regions 53 each time scanning irradiation for one row in the positive X axial direction and the negative X axial direction ends (step S600).

When the irradiation has not ended for all chip formation regions 53 (NO at step S600), the laser irradiation control unit 31 moves the irradiation region in the Y axial direction to set the irradiation region to a scanning irradiation start position on the next row (step S610). Then, the laser irradiation control unit 31 returns the processing to step S560 and repeatedly executes the same processing. When the irradiation has ended for all chip formation regions 53 (YES at step S600), the laser irradiation control unit 31 ends the scanning irradiation control.

5.3 Effect

With the scanning irradiation control according to the present modification, the travel distance of the XYZ stage 33 in the Y axial direction is reduced as compared to that in the second embodiment, and thus the throughput improves. In addition, since the laser-doping scanning irradiation and the post-annealing scanning irradiation are executed at each row, the accuracy of overlapping of the irradiation region A in the Y axial direction between laser doping and post annealing improves.

6. Second Modification

The following describes a second modification. In the first embodiment, the beam homogenizer 43a is disposed on the optical path between the high reflectance mirror 41b and the high reflectance mirror 41c as illustrated in FIG. 11, but the disposition position of the beam homogenizer 43a is not limited thereto.

Figure 28:
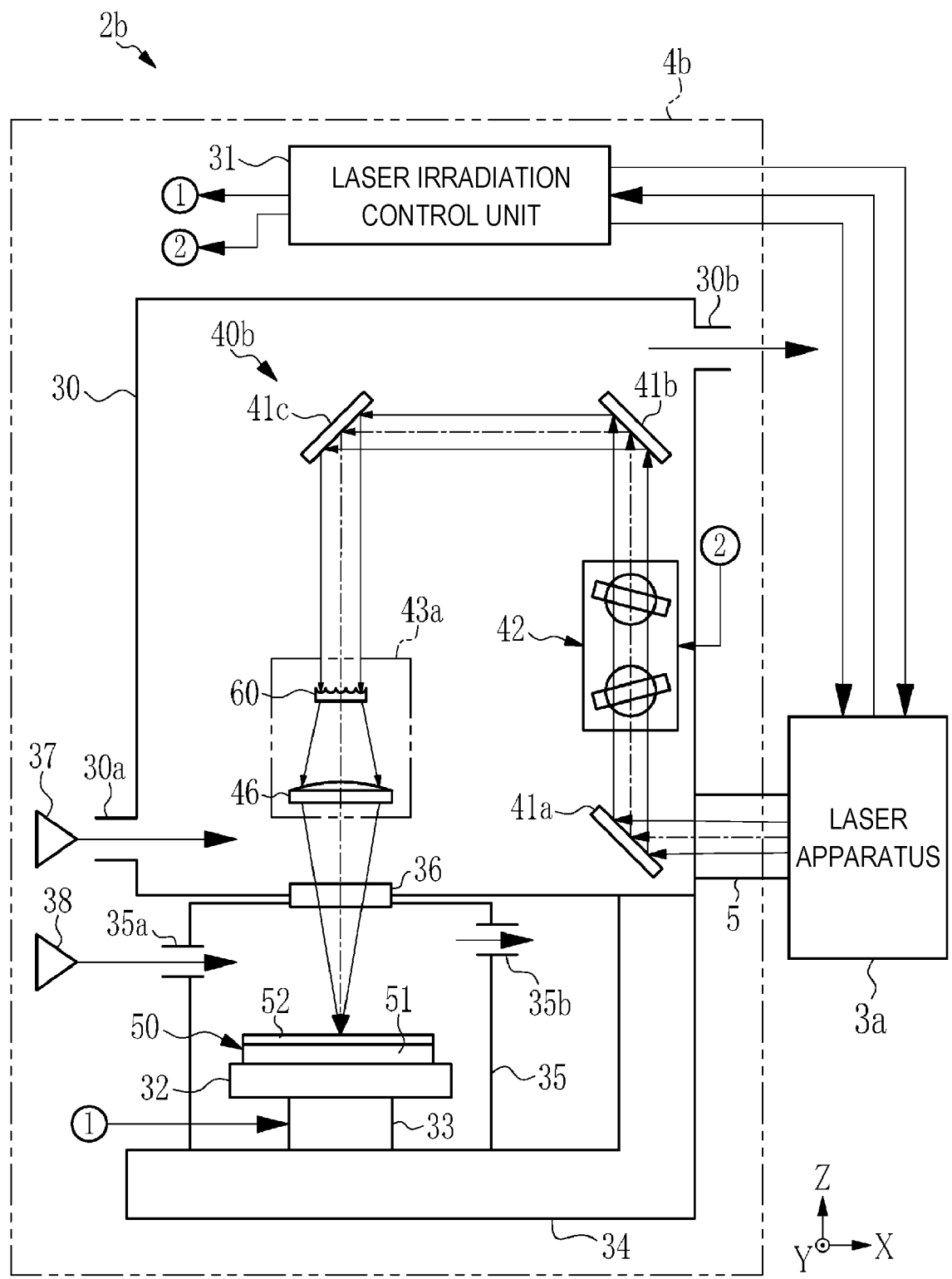
FIG. 28 is a diagram schematically illustrating the configuration of a laser irradiation system according to a second modification.

FIG. 28 schematically illustrates the configuration of a laser irradiation system 2b according to the present modification. The configuration of the laser irradiation system 2b is different from the configuration of the laser irradiation system 2 according to the first embodiment only in an optical system 40b included in a laser irradiation device 4b. In the optical system 40b, the beam homogenizer 43a is disposed on the optical path between the high reflectance mirror 41c and the window 36 in place of the transfer optical system 44.

Similarly to the first embodiment, the beam homogenizer 43a includes the fly-eye lens 60 and the condenser lens 46. In the present modification, the condenser lens 46 is disposed so that the focal point plane thereof coincides with the surface of the irradiation object 50. The condenser lens 46 provides Koehler illumination on the surface of the irradiation object 50.

The other configuration of the laser irradiation system 2b according to the present modification is same as the corresponding configuration of the laser irradiation system 2 according to the first embodiment.

The laser irradiation system 2b according to the present modification is also applicable to the second embodiment.

7. Modification of Laser Apparatus

Figure 29:
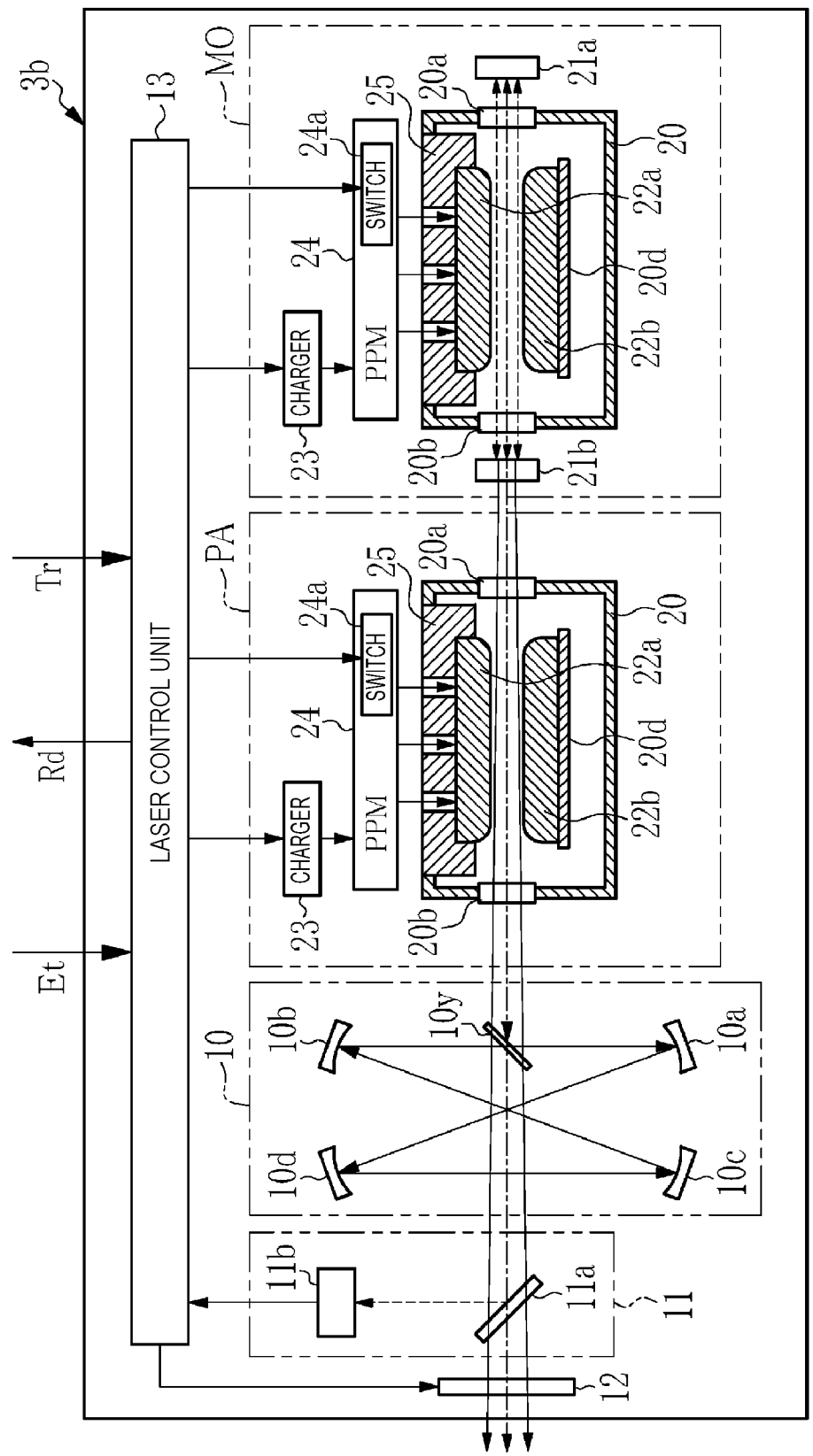
FIG. 29 is a diagram illustrating a modification of the laser apparatus.

The laser apparatus 3a of the first embodiment may be modified in various kinds of manners. The following describes one modification of the laser apparatus 3a. FIG. 29 illustrates the configuration of a laser apparatus 3b according to the present modification. The laser apparatus 3b includes, in addition to the configuration of the laser apparatus 3a of the first embodiment, an amplifier PA configured to amplify the energy of the pulse laser beam output from the master oscillator MO. The amplifier PA is disposed on the optical path of the pulse laser beam between the master oscillator MO and the OPS 10. The amplifier PA has a configuration same as that of the master oscillator MO except that no optical resonator is included. The amplifier PA includes the laser chamber 20, the charger 23, and the PPM 24.

When having received data such as the target pulse energy Et from the laser irradiation control unit 31, the laser control unit 13 controls the charge voltage of the charger 23 of each of the master oscillator MO and the amplifier PA so that laser oscillation is performed at a target value.

When having received the light emission trigger Tr from the laser irradiation control unit 31, the laser control unit 13 controls the master oscillator MO and the amplifier PA so that electrical discharging occurs when the pulse laser beam output from the master oscillator MO is incident in the electrical discharging space of the amplifier PA. Specifically, the laser control unit 13 inputs a signal synchronized with the light emission trigger Tr to the switch 24a of each of the master oscillator MO and the amplifier PA so that the electrical discharging occurs, thereby adjusting the "on" timing of the switch 24a. As a result, the pulse laser beam incident on the amplifier PA from the master oscillator MO is amplified and oscillated at the amplifier PA.

The pulse laser beam amplified at the amplifier PA and output is incident on the monitor module 11 through the OPS 10, and the pulse energy thereof is measured at the monitor module 11. The laser control unit 13 controls the charge voltage of the charger 23 of each of the master oscillator MO and the amplifier PA so that the measured value of the pulse energy approaches the target pulse energy Et. When the shutter 12 is opened, the pulse laser beam having transmitted through the beam splitter 11a of the monitor module 11 is incident on the laser irradiation device 4a.

In this manner, when provided with the amplifier PA, the laser apparatus 3b can output the laser beam having a high pulse energy.

8. Other Modifications

Figure 30:
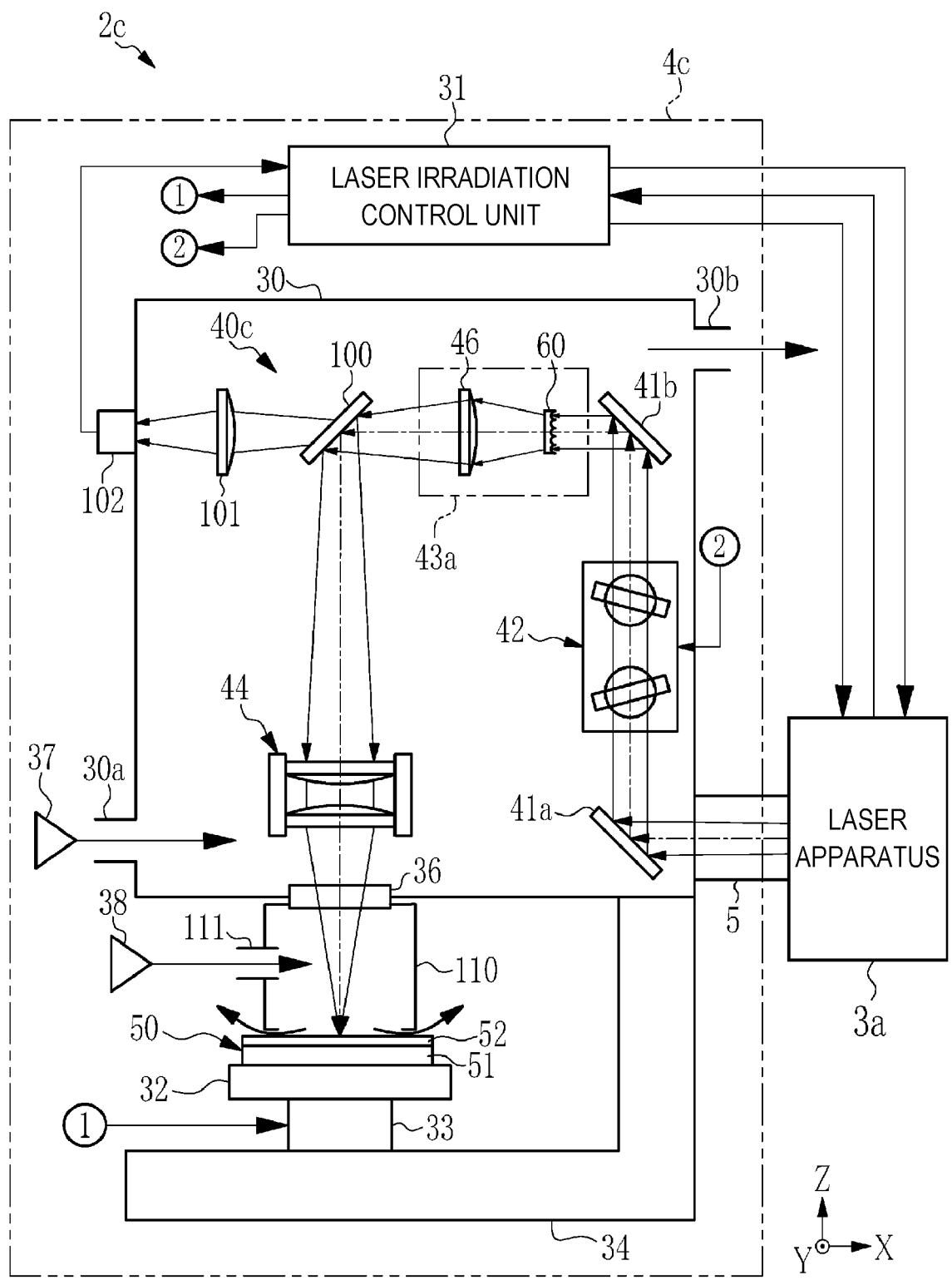
FIG. 30 is a diagram illustrating another modification of a laser irradiation device.

FIG. 30 illustrates another modification of a laser irradiation device. An optical system 40c included in a laser irradiation device 4c according to the present modification is different from the optical system 40a of the first embodiment in that a beam splitter 100 is provided in place of the high reflectance mirror 41c. The laser irradiation device 4c also includes a condenser lens 101 and an optical sensor 102.

The beam splitter 100 reflects and guides, to the transfer optical system 44, part of the pulse laser beam incident from the beam homogenizer 43a, and transmits and guides other part to the condenser lens 101. The condenser lens 101 condenses the transmitted light through the beam splitter 100 and causes the condensed light to be incident on the optical sensor 102. The optical sensor 102 measures the pulse energy of the pulse laser beam based on the incident light and inputs the measured value to the laser irradiation control unit 31. To reduce decrease of the use efficiency of light, the reflectance of the beam splitter 100 is preferably equal to or higher than 98% and lower than 100%.

The laser irradiation control unit 31 can control highly accurately fluence by controlling the transmittance of the attenuator 42 based on the measured value of the pulse energy input from the optical sensor 102.

In the present modification, an irradiation shield 110 does not entirely enclose the table 32 and the XYZ stage 33 unlike the irradiation shield 35 of the first embodiment, but encloses only a part including the irradiation position of the irradiation object 50. The irradiation shield 110 is provided with an intake port 111. The intake port 111 is connected with the second purge gas supply source 38 configured to supply the second purge gas. The shape of the irradiation shield 110 is, for example, a cylindrical shape. A minute gap is provided between part of a lower end part of the irradiation shield 110 and the surface of the irradiation object 50. The gap functions as a discharge port through which gas in the irradiation shield 110 is discharged.

Figure 31:
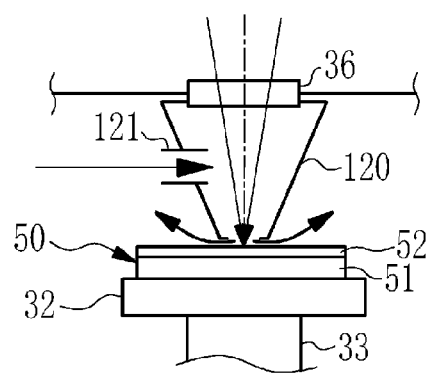
FIG. 31 is a diagram illustrating a modification of an irradiation shield.

The shape of the irradiation shield is not limited to a cylindrical shape. As illustrated in FIG. 31, an irradiation shield 120 having a circular cone shape may be used in place of the irradiation shield 110 having a cylindrical shape. The diameter of the irradiation shield 120 gradually decreases toward a lower end part.

The irradiation shield is not necessarily needed, but the irradiation object 50 may be disposed in a vacuum chamber to prevent oxide generation.

In each above-described embodiment, the OPS is provided in the laser apparatus, but is not necessarily needed when the pulse time width of the pulse laser beam output from the laser apparatus is within a range that allows laser doping.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more".

What is claimed is:

1. A laser irradiation method of irradiating an irradiation object in which an impurity source film containing at least an impurity element as a dopant is formed on a semiconductor substrate with a pulse laser beam having photon energy larger than the bandgap energy of the semiconductor substrate, the pulse laser beam generated by a laser irradiation system that includes
    a stage configured to move, in at least one scanning direction, an irradiation object in which an impurity source film containing at least an impurity element as a dopant is formed on a semiconductor substrate;
    a laser apparatus configured to generate the pulse laser beam having photon energy larger than the bandgap energy of the semiconductor substrate;
    an optical system through which the pulse laser beam is shaped to have a rectangular beam shape and incident on an irradiation region having a rectangular shape and set on the irradiation object; and
    a laser irradiation control unit configured to control the stage and the laser apparatus,
    the laser irradiation system configured to perform the laser irradiation method comprising:
        reading, as a first irradiation condition for laser doping, first fluence that is fluence per pulse of the pulse laser beam with which the irradiation region is irradiated and a first irradiation pulse number that is the number of irradiation pulses the irradiation region is irradiated, the number being equal to or larger than two, the first fluence being equal to or larger than a threshold at or beyond which ablation occurs to the impurity source film when the irradiation object is irradiated with the pulse laser beam in the same number of pulses as the first irradiation pulse number and smaller than a threshold at or beyond which damage occurs to a surface of the semiconductor substrate;
        calculating a first scanning speed Vdx based on Expression (e) below when Bx represents a width of the irradiation region in a scanning direction, Nd represents the first irradiation pulse number, and f represents a repetition frequency of the pulse laser beam; and
        moving the irradiation object at the first scanning speed Vdx relative to the irradiation region while irradiating the irradiation region with the pulse laser beam at the repetition frequency f $$Vdx = f \cdot Bx/Nd \qquad (e);$$

reading, as a second irradiation condition for post annealing, second fluence that is fluence per pulse of the pulse laser beam with which the irradiation region is irradiated and a second irradiation pulse number that is the number of irradiation pulses the irradiation region is irradiated, the number being equal to or larger than two, the second fluence being equal to or larger than a fluence threshold at or beyond which defects in the semiconductor substrate are repaired when the irradiation object is irradiated with the pulse laser beam in the same number of pulses as the second irradiation pulse number and smaller than a threshold at or beyond which damage occurs to the surface of the semiconductor substrate;
        calculating a second scanning speed Vpx based on Expression (f) below when Np represents the second irradiation pulse number; and
        moving the irradiation object at the second scanning speed Vpx relative to the irradiation region while irradiating the irradiation region with the pulse laser beam at the repetition frequency f $$Vpx = f \cdot Bx/Np \qquad (f);$$

the first fluence Fd and the second fluence Fp satisfy the expression Fp<Fd.

2. The laser irradiation method according to claim 1, further comprising:
    dimming the pulse laser beam output from the laser apparatus through an attenuator included in the laser irradiation system having a variable transmittance in accordance with the transmittance and outputting the pulse laser beam.

3. The laser irradiation method according to claim 2, wherein the laser irradiation control unit further performs processing of:
    calculating a transmittance Td of the attenuator for laser doping based on Expression (g) below when Fd represents the first fluence, Et represents pulse energy of the pulse laser beam output from the laser apparatus, and By represents a width of the irradiation region in a direction orthogonal to the scanning direction; and
    setting the transmittance of the attenuator to be the transmittance Td calculated based on Expression (g) below, $$Td = (Fd/Et)(Bx \cdot By) \qquad (g).$$

4. The laser irradiation method according to claim 3, wherein the laser irradiation control unit further performs processing of:
    calculating a transmittance Tp of the attenuator for post annealing based on Expression (h) below when Fp represents the second fluence; and
    setting the transmittance of the attenuator to be the transmittance Tp calculated based on Expression (h) below, $$Tp = (Fp/Et)(Bx \cdot By) \qquad (h).$$

5. The laser irradiation method according to claim 4, including shaping the pulse laser beam having transmitted through the attenuator to have a rectangular beam shape by transmitting the pulse laser beam through a beam homogenizer included as part of the optical system.

* * * * *